(12) United States Patent
      Lee et al.

(10) Patent No.:　　US 12,581,648 B2
(45) Date of Patent:　　Mar. 17, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Byoungil Lee, Hwaseong-si (KR); Sehoon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 745 days.

(21) Appl. No.: 18/062,837

(22) Filed: Dec. 7, 2022

(65) Prior Publication Data

US 2023/0217660 A1　　Jul. 6, 2023

(30) Foreign Application Priority Data

Jan. 4, 2022　(KR) ........................ 10-2022-0000644

(51) Int. Cl.
| | |
|---|---|
| *H10B 43/27* | (2023.01) |
| *H10B 41/27* | (2023.01) |
| *H10B 41/35* | (2023.01) |
| *H10B 41/50* | (2023.01) |
| *H10B 43/35* | (2023.01) |
| *H10B 43/50* | (2023.01) |

(52) U.S. Cl.
CPC ............. *H10B 43/27* (2023.02); *H10B 41/27* (2023.02); *H10B 41/35* (2023.02); *H10B 41/50* (2023.02); *H10B 43/35* (2023.02); *H10B 43/50* (2023.02)

(58) Field of Classification Search
CPC ........ H10B 43/27; H10B 41/27; H10B 41/50; H10B 43/50; H10B 41/35; H10B 43/35
See application file for complete search history.

(56) References Cited

U.S. PATENT DOCUMENTS

| | | |
|---|---|---|
| 11,056,503 B2 | 7/2021 | Kim |
| 2020/0273881 A1 | 8/2020 | Kim |

(Continued)

FOREIGN PATENT DOCUMENTS

| | | |
|---|---|---|
| KR | 2020/0132570 A | 11/2020 |
| KR | 10-2021-0032920 A | 3/2021 |

(Continued)

OTHER PUBLICATIONS

Office Action in Korean Appln. No. 10-2022-0000644, mailed on Aug. 27, 2025, 11 pages (with English translation).

*Primary Examiner* — Amar Movva
(74) *Attorney, Agent, or Firm* — Fish & Richardson P.C.

(57) ABSTRACT

A semiconductor device includes a lower structure, stack structure including gate electrodes stacked and spaced apart from each other on a first region of the lower structure and extending in a staircase shape on a second region of the lower structure, and interlayer insulating layers alternately stacked with the gate electrodes, channel structures penetrating through the gate electrodes on the first region, and isolation structures penetrating through the gate electrodes spaced apart from each other. Each channel structure a channel bent portion between first and second channel structures. Each isolation structure includes a first isolation bent portion between first and second isolation structures and a second isolation bent portion between second and third isolation structures. A width of an upper surface of the second isolation structure is narrower than a width of a lower surface of the third isolation structure.

20 Claims, 24 Drawing Sheets

(56) References Cited

U.S. PATENT DOCUMENTS

| 2020/0350326 | A1 | 11/2020 | Yun et al. |
| 2020/0365617 | A1 | 11/2020 | Ahn et al. |
| 2021/0143176 | A1 | 5/2021 | Yun et al. |
| 2021/0183885 | A1 | 6/2021 | Woo et al. |
| 2021/0305271 | A1 | 9/2021 | Kim et al. |
| 2021/0408028 | A1 | 12/2021 | Kim et al. |

FOREIGN PATENT DOCUMENTS

| KR | 10-2021-0121335 | A | 10/2021 |
| KR | 10-2021-0158703 | A | 12/2021 |

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2022-0000644, filed on Jan. 4, 2022 in the Korean Intellectual Property Office, the disclosure of which is incorporated herein by reference in its entirety.

BACKGROUND

Example embodiments of the present disclosure relate to a semiconductor devices and/or a data storage system including the same.

A semiconductor device able to store high-capacity data in a data storage system requiring data storage has been necessary. Accordingly, a method for increasing data storage capacity of a semiconductor device has been researched. For example, as a method for increasing data storage capacity of a semiconductor device, a semiconductor device including memory cells arranged three-dimensionally instead of memory cells arranged two-dimensionally has been suggested.

SUMMARY

An example embodiment of the present disclosure relates to a semiconductor device having improved production yield, and/or a data storage system including the same.

According to an example embodiment of the present disclosure, a semiconductor device may include a lower structure including a substrate, the lower structure including a first region and a second region; a stack structure on the lower structure; channel structures; and isolation structures. The stack structure may include gate electrodes stacked on each other on the first region of the lower structure. The electrodes may be spaced apart from each other in a vertical direction perpendicular to a surface of the lower structure. The gate electrodes may have a staircase shape on the second region of the lower structure and the gate electrodes may extend in a first horizontal direction. The first horizontal direction may be parallel to the surface of the lower structure, and the stack structure may include interlayer insulating layers alternately stacked with the gate electrodes. The channel structures may penetrate through the gate electrodes on the first region of the lower structure, and each of the channel structures may include a channel layer. The isolation structures may penetrate through the gate electrodes. The isolation structure may extend in the first horizontal direction, and the isolation structure may be spaced apart from each other in a second horizontal direction intersecting the first horizontal direction. Each of the channel structures may include a first channel structure, a second channel structure on the first channel structure, and a channel bent portion between the first channel structure and the second channel structure. Each of the isolation structures may include a first isolation structure, a second isolation structure on the first isolation structure, a third isolation structure on the second isolation structure, a first isolation bent portion between the first isolation structure and the second isolation structure, and a second isolation bent portion between the second isolation structure and the third isolation structure. A width of an upper surface of the second isolation structure may be narrower than a width of a lower surface of the third isolation structure.

According to an example embodiment of the present disclosure, a semiconductor device may include a peripheral circuit structure including a first substrate and circuit devices on the first substrate; a second substrate on the peripheral circuit structure; a first horizontal layer and a second horizontal conductive layer sequentially on the second substrate; gate electrodes stacked on the second horizontal conductive layer, the gate electrodes stacked on each other and spaced apart from each other in a first direction, the gate electrodes including lower gate electrodes and upper gate electrodes; interlayer insulating layers stacked on the gate electrodes, the interlayer insulating layers including lower interlayer insulating layers and upper interlayer insulating layers; an intermediate insulating layer between the lower gate electrodes and the upper gate electrodes; a channel structure penetrating through the gate electrodes and the interlayer insulating layers, the channel structure in contact with the second substrate, and the channel structure including a channel layer; a capping insulating layer covering the gate electrodes; and isolation structure penetrating through the gate electrodes and the interlayer insulating layers. The isolation structure may extend in a second direction perpendicular to the first direction. The channel structure may further include a channel bent portion at a first level in the intermediate insulating layer. The isolation structure may further include an isolation bent portion at a second level in the intermediate insulating layer. The first level may be lower than the second level.

According to an example embodiment of the present disclosure, a semiconductor device may include a semiconductor storage device including a lower structure, a stack structure on the lower structure, channel structures, isolation structures, and an input/output pad; and a controller electrically connected to the semiconductor storage device. The lower structure may include a first substrate, circuit devices on the first substrate, and a second substrate on the circuit devices. The second substrate may have a first region and a second region. The stack structure may include gate electrodes stacked and spaced apart from each other in a vertical direction on the first region of the second substrate. The vertical direction may be perpendicular to an upper surface of the lower structure. The gate electrodes may be on the second region of the second substrate may extend in a staircase shape in a first horizontal direction. The first horizontal direction may be parallel to the upper surface of the lower structure. The stack structure may include interlayer insulating layers alternately stacked with the gate electrodes. The channel structures may penetrate through the gate electrodes on the first region of the second substrate and each of the channel structures may include a channel layer. The isolation structures may penetrate through the gate electrodes. The isolation structures may extend in the first horizontal direction and may be spaced apart from each other in a second horizontal direction. The second horizontal direction may intersect the first horizontal direction. The input/output pad may be electrically connected to the circuit devices. The controller may be electrically connected to the semiconductor storage device through the input/output pad and may be configured to control the semiconductor storage device. Each of the channel structures may include a first channel structure, a second channel structure on the first channel structure, and a channel bent portion between the first channel structure and the second channel structure. Each of the isolation structures may include a first isolation structure, a second isolation structure on the first isolation structure, a third isolation structure on the second isolation structure, a first isolation bent portion between the first isolation structure and the second isolation structure, and a second isolation bent portion between the second isolation structure and the third isolation structure. A width of an upper surface of the second isolation structure may be narrower than a width of a lower surface of the third isolation structure.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
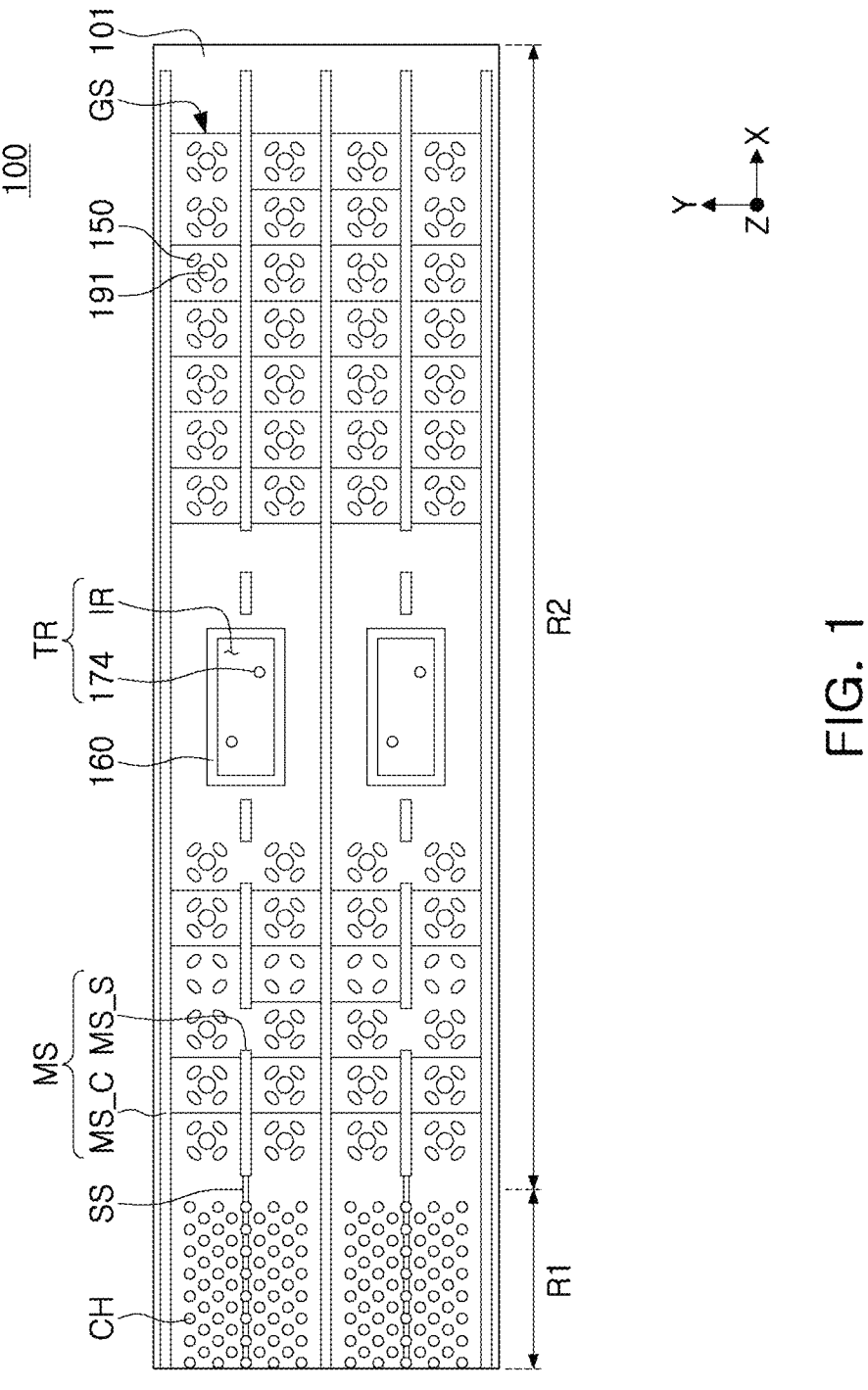
FIGS. 1 and 2 are plan diagrams illustrating a semiconductor device according to an example embodiment of the present disclosure.
Figure 2:
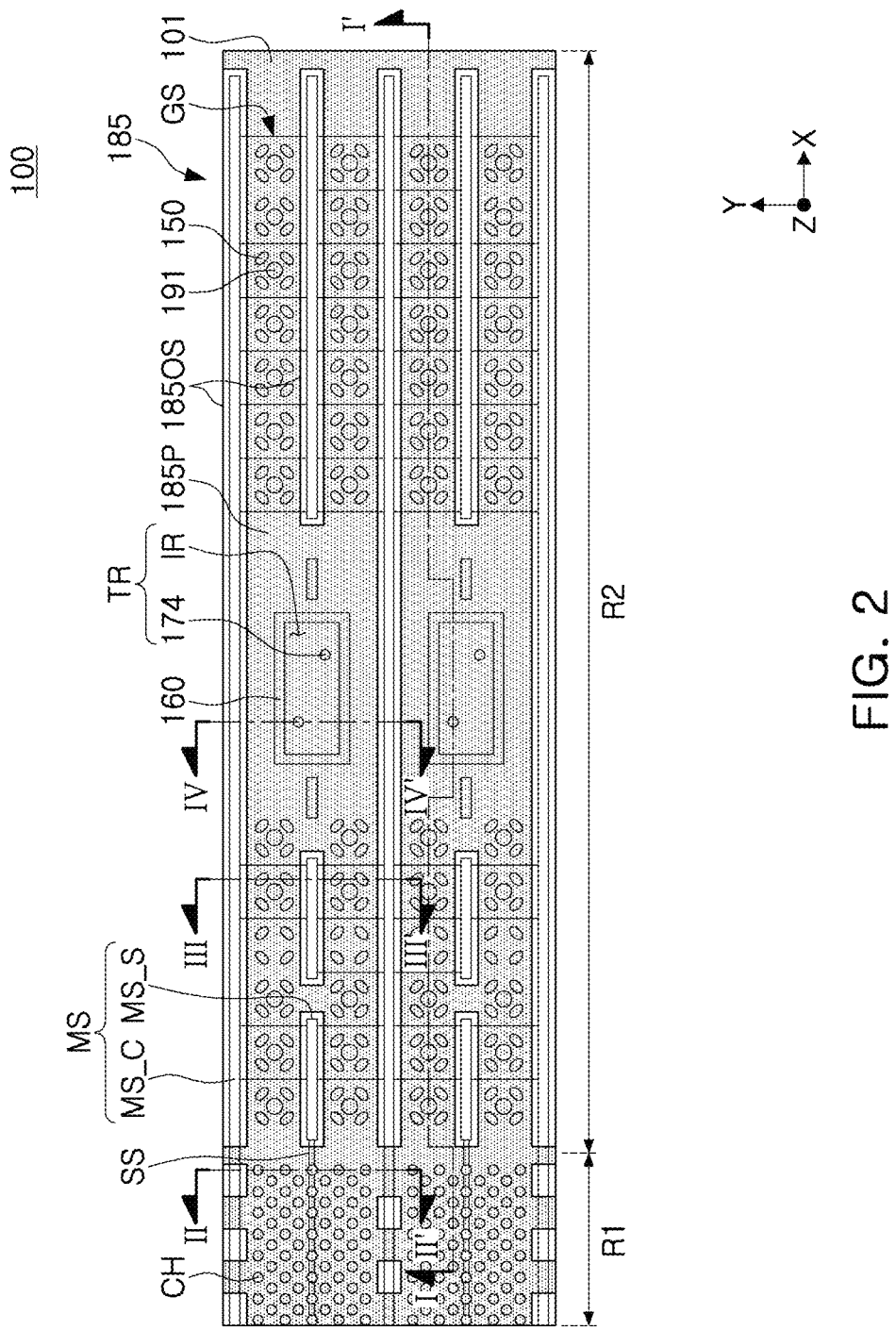

FIGS. 1 and 2 are plan diagrams illustrating a semiconductor device 100 according to example embodiments. FIG. 2 further includes an upper support structure in addition to the example in FIG. 1.

Figure 3A:
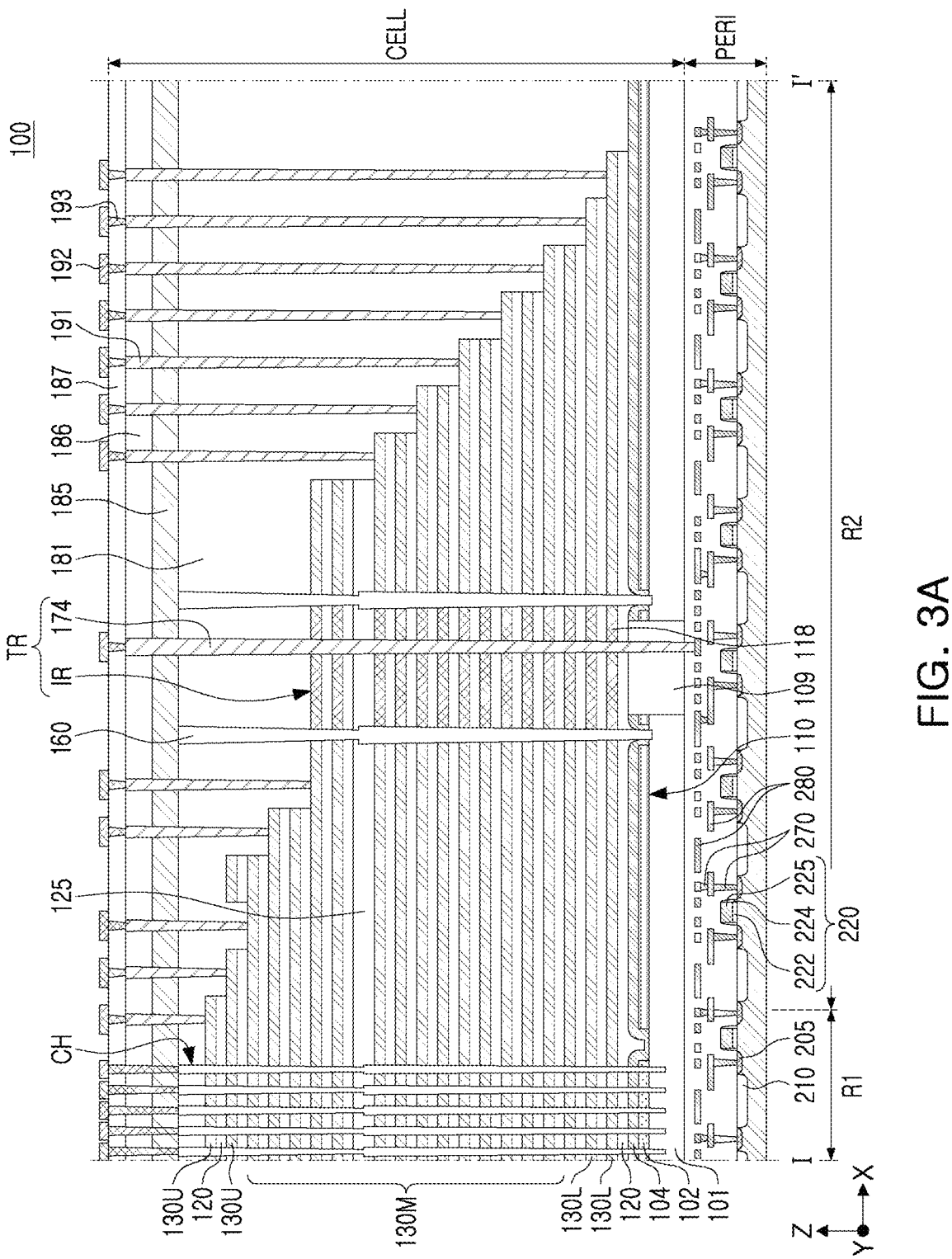
FIGS. 3A to 3D are cross-sectional diagrams illustrating a semiconductor device according to an example embodiment of the present disclosure.
Figure 3B:
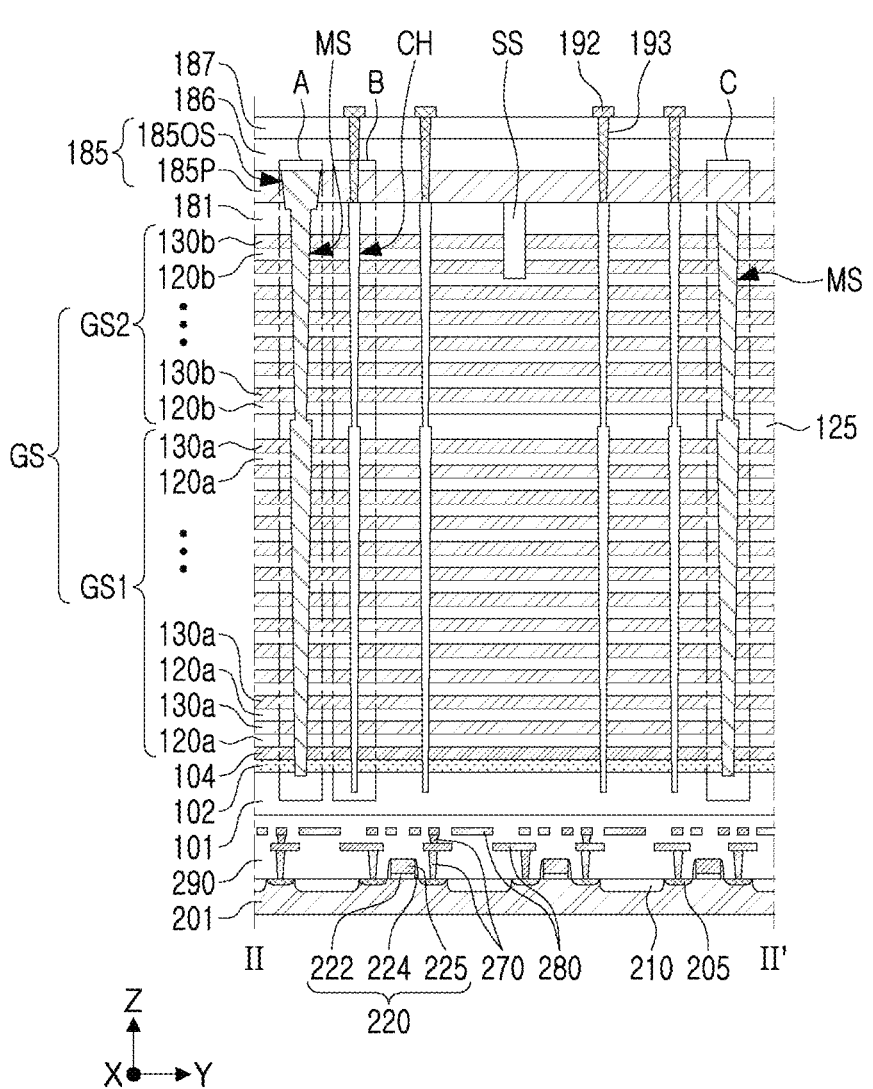
Figure 3C:
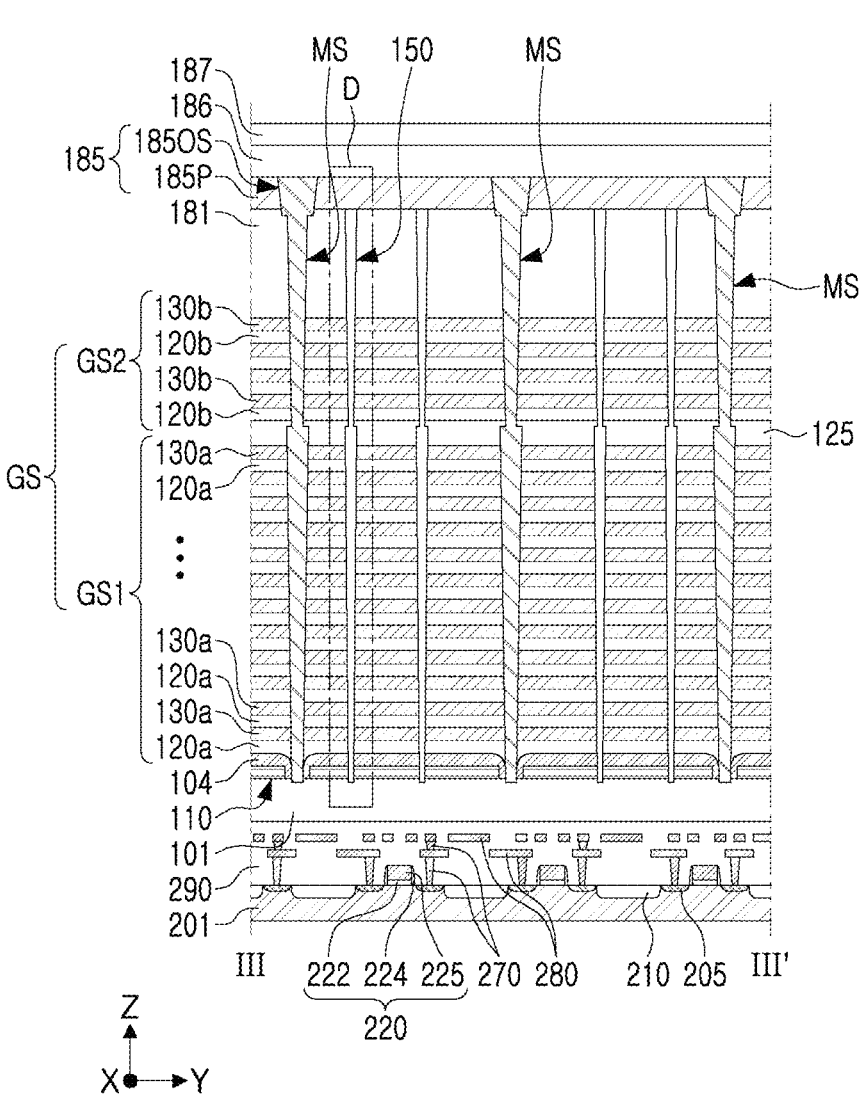
Figure 3D:
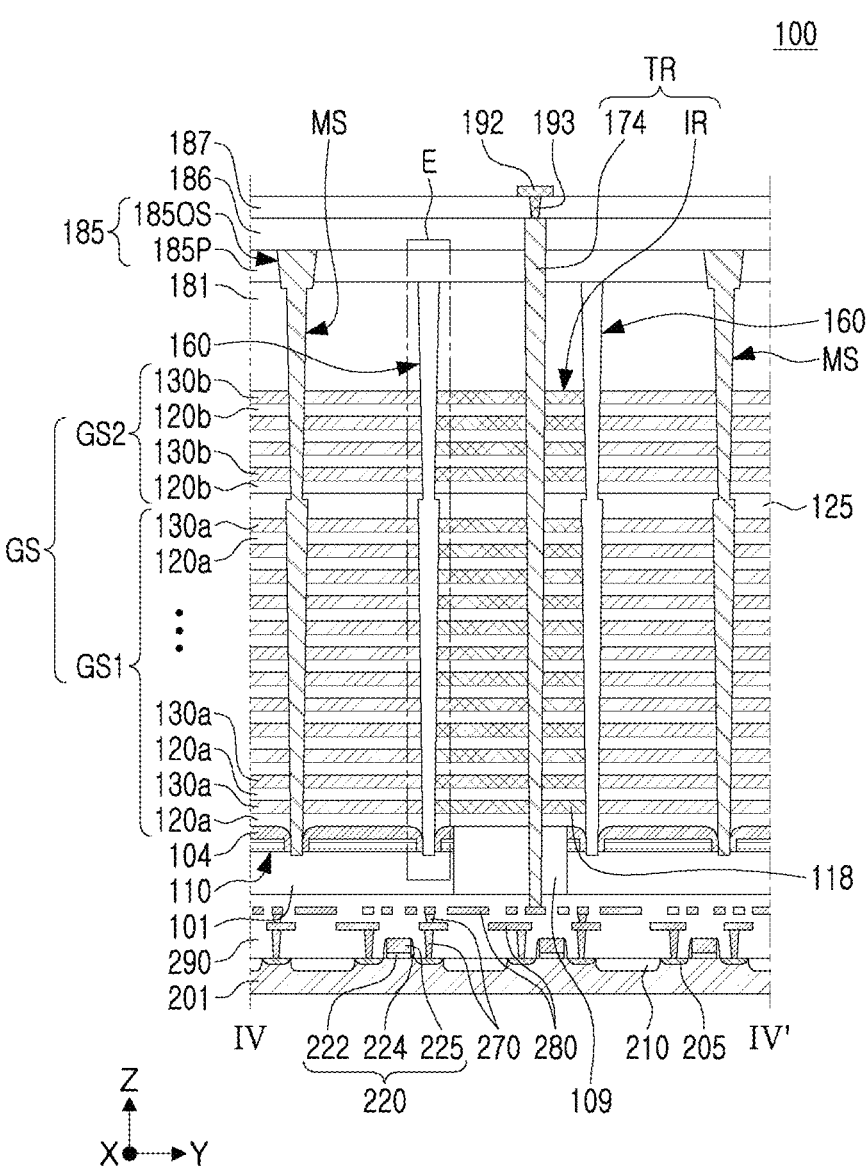

FIGS. 3A to 3D are cross-sectional diagrams illustrating a semiconductor device 100 according to example embodiments. FIG. 3A is a cross-sectional diagram taken along line I-I' in FIG. 2, FIG. 3B is a cross-sectional diagram taken along line II-IF in FIG. 2, and FIG. 3C is a cross-sectional diagram taken along line III-III' in FIG. 2, and FIG. 3D is a cross-sectional diagram taken along line IV-IV' in FIG. 2.

Figure 4A:
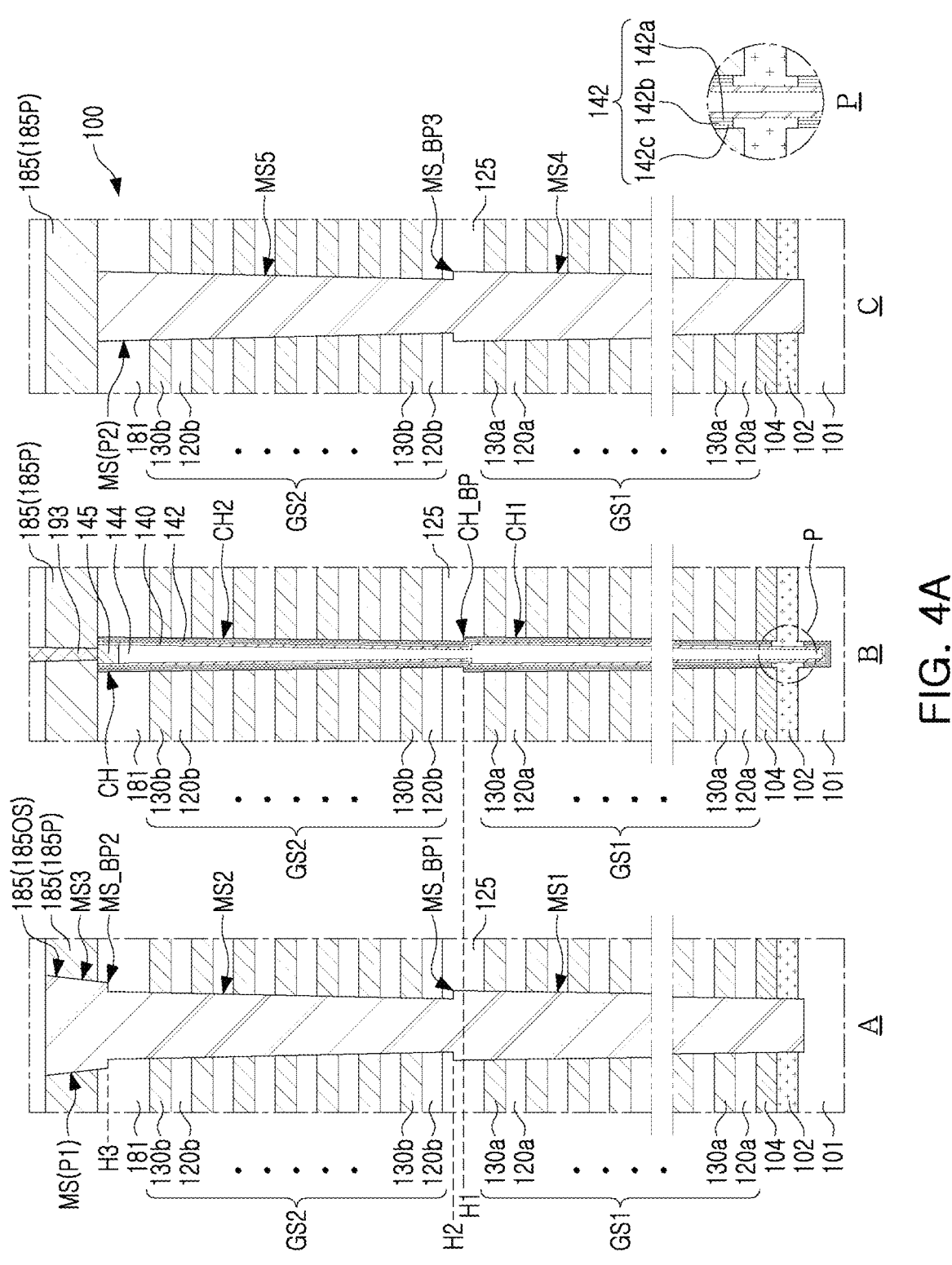
FIGS. 4A and 4B are enlarged diagrams illustrating a portion of a semiconductor device according to an example embodiment of the present disclosure.
Figure 4B:
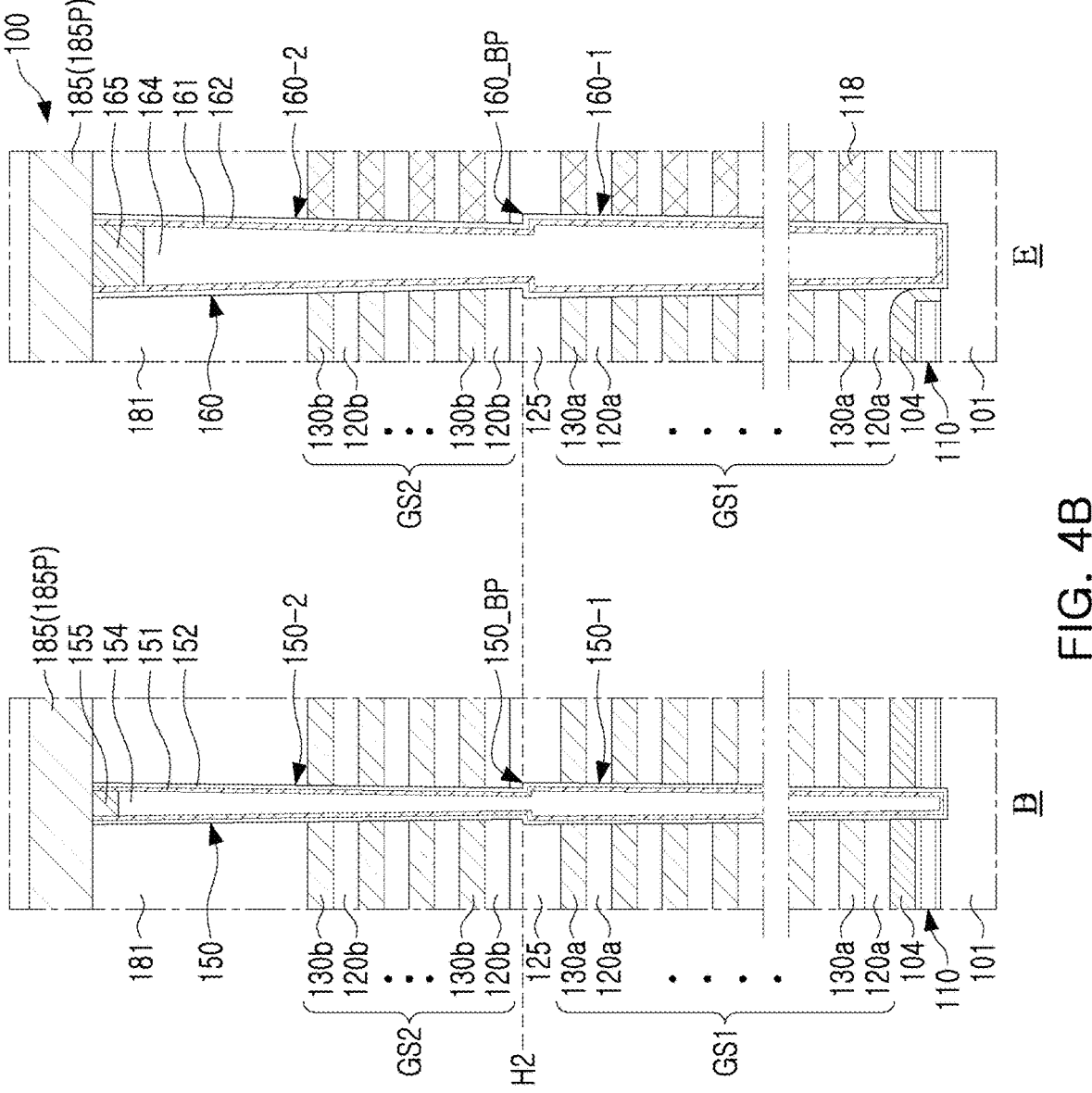

FIGS. 4A and 4B are enlarged diagrams illustrating a portion of a semiconductor device according to example embodiments. FIG. 4A is an enlarged diagram illustrating region "A," region "B," and region "C" in FIG. 3B, and FIG. 4B is an enlarged diagram illustrating region "D" in FIG. 3C and region "E" in FIG. 3D.

Referring to FIGS. 1 to 4B, the semiconductor device 100 may include a peripheral circuit structure PERI including a first substrate 201 and a memory cell structure CELL including a second substrate 101, and may further include a through wiring region TR including a through contact plug 180 electrically connecting the peripheral circuit structure PERI to the memory cell structure CELL. The memory cell structure CELL may be disposed on the peripheral circuit PERI, and the through wiring region TR may penetrate through the memory cell structure CELL and may connect the memory cell structure CELL to the peripheral circuit structure PERI. Alternately, in example embodiments, the memory cell structure CELL may be disposed below the peripheral circuit structure PERI. Also, in example embodiments, the memory cell structure CELL and the peripheral circuit structure PERI may be bonded to each other by, for example, copper (Cu)-copper (Cu) bonding.

The peripheral circuit structure PERI may include a first substrate 201, source/drain regions 205 and device isolation layers 210 disposed in the first substrate 201, circuit devices 220 disposed on the first substrate 201, circuit contact plugs 270, circuit wiring lines 280, and a peripheral region insulating layer 290.

The first substrate 201 may have an upper surface extending in the X-direction and the Y-direction. An active region may be defined by the device isolation layers 210 in the first substrate 201. Source/drain regions 205 including impurities may be disposed in a portion of the active region. The first substrate 201 may include a semiconductor material, such as, for example, a group IV semiconductor, a group III-V compound semiconductor, or a group II-VI compound semiconductor. The first substrate 201 may be provided as a bulk wafer or an epitaxial layer.

The circuit devices 220 may include a planar transistor. Each of the circuit devices 220 may include a circuit gate dielectric layer 222, a spacer layer 224, and a circuit gate electrode 225. The source/drain regions 205 may be disposed in the first substrate 201 on both sides of the circuit gate electrode 225.

The peripheral region insulating layer 290 may be disposed on the circuit devices 220 on the first substrate 201. The circuit contact plugs 270 may penetrate through the peripheral region insulating layer 290 and may be connected to the source/drain regions 205. Electrical signals may be applied to the circuit devices 220 by the circuit contact plugs 270. In a region not illustrated, circuit contact plugs 270 may also be connected to the circuit gate electrode 225. The circuit wiring lines 280 may be connected to the circuit contact plugs 270 and may be disposed in a plurality of layers.

The memory cell structure CELL may include a stack structure GS including a second substrate 101 having a first region R1 and a second region R2, a first horizontal conductive layer 102 disposed on the first region R1 of the second substrate 101, a horizontal insulating layer 110 disposed in parallel with the first horizontal conductive layer 102 on the second region R2 of the second substrate 101, a second horizontal conductive layer 104 on the first horizontal conductive layer 102 and the horizontal insulating layer 110, gate electrodes 130 and interlayer insulating layers 120 alternately stacked on the second horizontal conductive layer 104, a capping insulating layer 181 covering the stack structure GS, the upper support structure 185 on the capping insulating layer 181, isolation structures MS extending through the stack structure GS, an upper isolation structures SS penetrating through a portion of the stack structure GS, and channel structures CH disposed to penetrate through the stack structure GS and including a channel layer 140. In an example embodiment, the memory cell structure CELL may further include upper insulating layers 186 and 187, a gate contact plug 191, wiring lines 192, and a wiring via 193. In the example embodiments, the second substrate 101, the first horizontal conductive layer 102, the horizontal insulating layer 110, and the second horizontal conductive layer 104 of the peripheral circuit structure PERI and the memory cell structure CELL may be referred to as a "lower structure."

In the first region R1 of the second substrate 101, the gate electrodes 130 may be vertically stacked and the channel structures CH may be disposed, and memory cells may be disposed in the first region R1. On the second region R2, the gate electrodes 130 may extend to have different lengths, and the second region R2 may be to electrically connect the memory cells to the peripheral circuit structure PERI. The second region R2 may be disposed on at least one end of the first region R1 in at least one direction, such as, for example, the X-direction.

The second substrate 101 may have an upper surface extending in the X-direction and the Y-direction. The second substrate 101 may include a semiconductor material, such as, for example, a group VI semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as an epitaxial layer or a polycrystalline semiconductor layer such as a polycrystalline silicon layer.

The first and second horizontal conductive layers 102 and 104 may be stacked in sequence on the upper surface of the first region R1 of the second substrate 101. The first horizontal conductive layer 102 may not extend to the second region R2 of the second substrate 101, and the second horizontal conductive layer 104 may extend to the second region R2.

The first horizontal conductive layer 102 may function as a portion of a common source line of the semiconductor device 100, and may function as, for example, a common source line together with the second substrate 101. As illustrated in the enlarged diagram in FIG. 4A, the first horizontal conductive layer 102 may be directly connected to the channel layer 140 around the channel layer 140.

The second horizontal conductive layer 104 may be in contact with the second substrate 101 in a portion of regions in which the first horizontal conductive layer 102 and the horizontal insulating layer 110 are not disposed. The second horizontal conductive layer 104 may cover an end of the first horizontal conductive layer 102 or the horizontal insulating layer 110 and may be bent in the above regions, and may extend to the second substrate 101. That is, the second horizontal conductive layer 104 may fill a space between the first horizontal conductive layer 102 and the horizontal insulating layer 110.

The first and second horizontal conductive layers 102, 104 may include a semiconductor material, and, for example, the first and second horizontal conductive layers 102, 104 may both include polycrystalline silicon. In this case, at least the first horizontal conductive layer 102 may be a doped layer, and the second horizontal conductive layer 104 may be a doped layer or a layer including impurities diffused from the first horizontal conductive layer 102. However, in example embodiments, the second horizontal conductive layer 104 may be replaced with an insulating layer.

The horizontal insulating layer 110 may be disposed on the second substrate 101 in parallel to the first horizontal conductive layer 102 in at least a portion of the second region R2. The horizontal insulating layer 110 may include first to third horizontal insulating layers stacked in sequence on the second region R2 of the second substrate 101. The horizontal insulating layer 110 may be layers remaining after a portion of the horizontal insulating layer 110 is replaced with the first horizontal conductive layer 102 in the process of manufacturing the semiconductor device 100.

The horizontal insulating layer 110 may include silicon oxide, silicon nitride, silicon carbide, or silicon oxynitride. The first and third horizontal insulating layers and the second horizontal insulating layer may include different insulating materials. The first and third horizontal insulating layers may include the same material. For example, the first and third horizontal insulating layers may be formed of the same material as a material of the interlayer insulating layers 120, and the second horizontal insulating layer may be formed of the same material as a material of the sacrificial insulating layers 118.

The gate electrodes 130 may be vertically stacked and spaced apart from each other on the second substrate 101 and may be included in the stack structure GS. The gate electrodes 130 may include a lower gate electrode 130L forming a gate of the ground select transistor, memory gate electrodes 130M forming a plurality of memory cells, and upper gate electrodes 130U forming gates of string select transistors. The number of memory gate electrodes 130M the memory cells may be determined according to capacity of the semiconductor device 100. In example embodiments, the number of each of the upper and lower gate electrodes 130U and 130L may be one to four or more, and may have a structure that is the same as or different from that of the memory gate electrodes 130M. In example embodiments, the gate electrodes 130 may further include a gate electrode 130 disposed on the upper gate electrodes 130U and/or below the upper gate electrode 130L and included in an erase transistor used for an erase operation using a gate induced drain leakage (GIDL) phenomenon. Also, a portion of the gate electrodes 130, such as, for example, the memory gate electrodes 130M adjacent to the upper or lower gate electrodes 130U and 130L may be dummy gate electrodes.

The gate electrodes 130 may be vertically stacked and spaced apart from each other on the first region R1, and may extend from the first region R1 to the second region R2 by different lengths and may form a stepped structure. As illustrated in FIG. 3A, the gate electrodes 130 may form a stepped structure between the gate electrodes 130 in the X-direction. In example embodiments, at least a portion of the gate electrodes 130, that is, a desired and/or alternatively predetermined number of the gate electrodes 130, such as, for example, two to six gate electrodes 130 may form a single gate group and a stepped structure may be formed between the gate groups in the X-direction. In this case, the gate electrodes 130 included in one of the gate groups may be disposed to have a stepped structure in the Y-direction as well. Due to the stepped structure, the gate electrodes 130 may form a staircase shape in which the lower gate electrode 130 may extend longer than the upper gate electrode 130, and may provide ends exposed upwardly from the interlayer insulating layers 120. In example embodiments, the gate electrodes 130 may have an increased thickness on the ends.

As illustrated in FIG. 1, the gate electrodes 130 may be isolated from each other in the Y-direction by isolation structures MS extending in the X-direction. The gate electrodes 130 disposed between a pair of central isolation structures MS_C may form a single memory block, but example embodiments are not limited thereto. A portion of the gate electrodes 130, such as, for example, the memory gate electrodes 130M, may form a single layer in a single memory block.

The gate electrodes 130 may include a metal material, such as, for example, tungsten (W). In example embodiments, the gate electrodes 130 may include polycrystalline silicon or a metal silicide material. In example embodiments, the gate electrodes 130 may further include a diffusion barrier, and for example, the diffusion barrier may include tungsten nitride (WN), tantalum nitride (TaN), or titanium nitride (TiN) or a combination thereof.

In an example embodiment, the gate electrodes 130 may further include a gate electrode layer and a gate dielectric layer covering a side surfaces, an upper surface, and a lower surface of the gate electrode layer. The gate dielectric layer may be disposed between the interlayer insulating layers 120 and the channel structures CH and the gate electrode layer. The gate dielectric layer may include, for example, aluminum oxide (AlO).

The interlayer insulating layers 120 may be alternately stacked with the gate electrodes 130 on the second substrate 101. The interlayer insulating layers 120 may be disposed between the gate electrodes 130. Similar to the gate electrodes 130, the interlayer insulating layers 120 may be spaced apart from each other in a direction perpendicular to the upper surface of the second substrate 101 and may be disposed to extend in the X-direction. The interlayer insulating layers 120 may include an insulating material such as silicon oxide or silicon nitride.

In an example embodiment, the stack structure GS may include a lower stack structure GS1 and an upper stack structure GS2, and may further include an intermediate insulating layer 125 disposed between the upper and lower stack structures GS1 and GS2. The lower stack structure GS1 may include first gate electrodes 130a and first interlayer insulating layers 120a alternately stacked. The upper stack structure GS2 may include second gate electrodes 130b and second interlayer insulating layers 120b alternately stacked. The first gate electrodes 130a may include a lower gate electrode 130L, and the second gate electrodes 130b may include an upper gate electrode 130U. In an example embodiment, the number of the first gate electrodes 130a may be greater than the number of the second gate electrodes 130b, but the number of the first and second gate electrodes 130a and 130b is not limited thereto and may be varied.

The capping insulating layer 181 may cover the stack structure GS on the second substrate 101. In an example embodiment, the capping insulating layer 181 may include the same material as a material of the interlayer insulating layers 120, and may include, for example, silicon oxide.

The upper support structure 185 may be disposed on the capping insulating layer 181 and may cover the capping insulating layer 181. As illustrated in FIG. 2, the upper support structure 185 may include a plurality of through regions 185OS disposed in positions overlapping the isolation structures MS. A portion of the upper support structure 185 other than the plurality of through regions 185OS may be referred to as a support pattern 185P. The support pattern 185P may overlap the gate electrodes 130 in the Z-direction. Each of the plurality of through regions 185OS may penetrate through the upper support structure 185 in the Z-direction. The upper support structure 185 may include an insulating material, such as, for example, silicon oxide, silicon nitride, or silicon oxynitride. Since the upper support structure 185 includes the support pattern 185P and the plurality of through regions 185OS, inclination of the stack structure GS formed by the gate electrodes 130 may be prevented. Also, the plurality of through regions 185OS may provide an inflow path for an etchant for replacing at least a portion of the sacrificial insulating layers 118 with the gate electrodes 130 during the process of manufacturing the semiconductor device 100.

The isolation structures MS may be disposed to penetrate through the gate electrodes 130 and to extend in the X-direction. The isolation structures MS may penetrate through the entire gate electrodes 130 stacked on the second substrate 101 may be connected to the second substrate 101. The isolation structures MS may penetrate through the first horizontal conductive layer 102 on the first region R1 and may penetrate through the horizontal insulating layer 110 on the second region R2. The isolation structures MS may further include a portion extending in a direction toward the horizontal conductive layer 102 in a region penetrating the horizontal conductive layer 102, but the form of the isolation structures MS is not limited thereto. The isolation structures MS may be spaced apart from each other in the Y-direction and may be disposed in parallel to each other.

In an example embodiment, the isolation structures MS may include central isolation structures MS_C extending as a single structure in the x direction and auxiliary isolation structure MS_S intermittently extending between a pair of central isolation structures MS_C or may be disposed in a partial region. In an example embodiment, the auxiliary isolation structure MS_S may be disposed only on the second region R2 and may intermittently extend in the X-direction, but an example embodiment thereof is not limited thereto, and the auxiliary isolation structure MS_S may have a shape in which the auxiliary isolation structure MS_S may extend as a single structure in the first region R1 and may intermittently extend in the X-direction. Also, a plurality of auxiliary isolation structures MS_S may be disposed between a pair of central isolation structures MS1. However, in example embodiments, the shape of the isolation structures MS1 and MS2, arrangement relationship between the isolation structures MS1 and MS2, and the number of the isolation structures MS1 and MS2 may be varied.

Referring to FIGS. 2 to 3D, a plurality of through regions 185OS of the upper support structure 185 may be intermittently spaced apart from each other in the X-direction on the first region R1. The plurality of through regions 185OS may be arranged in a zigzag manner in the Y-direction on the first region R1. The plurality of through regions 185OS may overlap the isolation structures MS on the second region R2 and may extend continuously in the X-direction. However, in example embodiments, the arrangement relationship between the plurality of through regions 185OS and the size of the plurality of through regions 185OS may be varied.

As illustrated in FIG. 1, the upper isolation structures SS may extend in the X-direction between the central isolation structures MS_C on the first region R1. The upper isolation structures SS may be disposed to penetrate a portion of the gate electrodes 130 including an uppermost upper gate electrode 130U among the gate electrodes 130. As illustrated in FIG. 3B, the upper isolation structures SS may penetrate through at least one gate electrode 130 including the upper gate electrodes 130U and may allow the gate electrodes 130 to be isolated from each other in the Y-direction. However, the number of gate electrodes 130 isolated by the upper isolation structures SS may be varied in example embodiments. The upper gate electrodes 130U isolated by the upper isolation structures SS may form different string selection lines. The upper isolation structures SS may include an insulating material. The insulating material may include, for example, silicon oxide, silicon nitride, or silicon oxynitride.

As illustrated in FIG. 1, each of the channel structures CH may form a memory cell string, and the channel structures CH may be spaced apart from each other while forming rows and columns on the first region R1. The channel structures CH may be disposed to form a grid pattern or may be disposed in a zigzag pattern in one direction. The channel structures CH may have a columnar shape, and may have an inclined side surface of which a width may decrease toward the second substrate 101 depending on an aspect ratio.

The channel structures CH may penetrate through the gate electrodes 130, the second horizontal conductive layer 104, and the first horizontal conductive layer 102 and may be in contact with the second substrate 101. The channel structures CH may extend into the second substrate 101 and may be in contact with the second substrate 101, but an example embodiment thereof is not limited thereto.

Referring to FIG. 4A, the channel layer 140 may be disposed in the channel structures CH. In the channel structures CH, the channel layer 140 may be formed in an annular shape surrounding the channel filling insulating layer 144 therein, or alternatively, in example embodiments, the channel filling insulating layer 144 may have a columnar shape such as a cylindrical shape or a prism shape. The channel filling insulating layer 144 may include an insulating material such as silicon oxide. The channel layer 140 may be connected to the first horizontal conductive layer 102 in a lower portion. The channel layer 140 may include a semiconductor material such as polycrystalline silicon or single crystal silicon.

In an example embodiment, each of the channel structures CH may further include a dielectric layer 142 and a conductive pad 145.

The dielectric layer 142 may be disposed between the gate electrodes 130 and the channel layer 140. The dielectric layer 142 may surround at least a portion of an external side surface of the channel layer 140. As illustrated in the enlarged diagram in FIG. 4A, the dielectric layer 142 may include a tunneling layer 142a, a charge storage layer 142b, and a blocking layer 142c stacked in sequence from the channel layer 140. The tunneling layer 142a may tunnel charges into the charge storage layer 142b, and may include, for example, silicon oxide ($SiO_2$), silicon nitride ($Si_3N_4$), silicon oxynitride (SiON), or a combination thereof. The charge storage layer 142b may be configured as a charge trap layer or a floating gate conductive layer. The blocking layer 142c may block charges trapped in the charge storage layer 142b from moving to the gate electrodes 130, and may include, for example, silicon oxide ($SiO_2$), silicon nitride ($Si_3N_4$), silicon oxynitride (SiON), a high-k dielectric material, or a combination thereof. As illustrated in the enlarged diagram in FIG. 4A, the first horizontal conductive layer 102 may include a portion penetrating through the dielectric layer 142 and in contact with the channel layer 140. The contact portion may cover at least a portion of a side surface of the second horizontal conductive layer 104 and at least a portion of a side surface of the second substrate 101.

The conductive pad 145 may be disposed to be electrically connected to the channel layer 140. In the example embodiment, the conductive pad 145 may cover an upper surface of the channel filling insulating layer 144 on the upper surface of the channel filling insulating layer 144, and the channel layer 140 may surround a side surface of the conductive pad 145, or alternatively, the conductive pad 145 may be disposed on the channel layer 140. The conductive pad 145 may include, for example, doped polycrystalline silicon.

In an example embodiment, each of the channel structures CH may include a first channel structure CH1 and a second channel structure CH2 on the first channel structure CH1. The first channel structure CH1 may penetrate through the lower stack structure GS1 and may be in contact with the second substrate 101, and the second channel structure CH2 may penetrate through the upper stack structure GS2 and may be in contact with an upper surface of the first channel structure CH1. The first and second channel structures CH1 and CH2 may be integrally connected to each other, and the channel layer 140 may continuously extend within the first and second channel structures CH1 and CH2. In the example embodiments, "integrally connected" may refer to the configuration in which specific materials may be filled in a plurality of holes which may be connected to each other by being formed by a separate process, such that the materials may continuously extend without distinction of an interfacial surface. The upper surface of the first channel structure CH1 and the lower surface of the second channel structure CH2 may be in contact with each other on a first level H1 in the intermediate insulating layer 125.

In an example embodiment, each of the channel structures CH may include a channel bent portion CH_BP in a region in which the first and second channel structures CH1 and CH2 may be in contact with each other. The channel bent portion CH_BP may be disposed on the first level H1. The channel bent portion CH_BP may be formed as a width of an upper surface of the first channel structure CH1 is greater than a width of a lower surface of the second channel structure CH2. Accordingly, the width of each of the channel structures CH may discontinuously change on a level on which the channel bent portion CH_BP is disposed.

In an example embodiment, the upper support structure 185 may cover the upper surface of the channel structure CH.

Referring to FIG. 4A, the isolation structures MS may be filled with an insulating material. The insulating material may include silicon oxide, silicon nitride, silicon oxynitride, or a combination thereof.

In example embodiments, an isolation insulating layer formed of the insulating material and a dielectric isolation layer disposed between the isolation insulating layer and the stack structure GS may be further included. The isolation dielectric layer may be formed by the same process of forming the gate dielectric layer. Accordingly, the isolation dielectric layer may be integrally connected to the gate dielectric layer. The isolation dielectric layer may include, for example, aluminum oxide (AlO). The internal structure of the isolation structures MS is not limited thereto, and may be varied. For example, the isolation structures MS may include a plurality of insulating layers or a metal oxide layer disposed between the isolation insulating layer and the isolation dielectric layer.

Referring to FIGS. 2 and 4A, each of the isolation structures MS may include a first portion P1 overlapping the plurality of through regions 185OS in the Z-direction and a second portion P2 overlapping the support patterns 185P. Each of the isolation structures MS may have a form in which the first portion P1 and the second portion P2 may be integrally connected to each other in the Y-direction.

The first portion P1 of the isolation structures MS may include a first isolation structure MS1, a second isolation structure MS2 on the first isolation structure MS1, a third isolation structure MS3 on the second isolation structure MS2. The first isolation structure MS1 may penetrate through the lower stack structure GS1, the second isolation structure MS2 may penetrate through the upper stack structure GS2 and may be in contact with an upper surface of the first isolation structure MS1, and the third isolation structure MS3 may penetrate at least a portion of the upper support structure 185 and the capping insulating layer 181 and may be in contact with an upper surface of the second isolation structure MS2. The first to third isolation structures MS1, MS2, and MS3 may be integrally connected to each other.

In an example embodiment, an average width of the first isolation structure MS1 may be greater than an average width of the second isolation structure MS2, but an example embodiment thereof is not limited thereto.

The upper surface of the first isolation structure MS1 and the lower surface of the second isolation structure MS2 may be in contact with each other on a second level H2 in the intermediate insulating layer 125. In the intermediate insulating layer 125, the second level H2 may be disposed on a level higher than a level of the first level H1. The upper surface of the second isolation structure MS2 and the lower surface of the third isolation structure MS3 may be in contact with each other on a third level H3 higher than the level of the upper surface of the uppermost gate electrode 130 and lower than the level of the upper surface of the capping insulating layer 181.

In an example embodiment, the first portion P1 of the isolation structures MS may include a first isolation bent portion MS_BP1 in a region in which the first and second isolation structures MS1 and MS2 are in contact with each other, and may include a second isolation bent portion MS_BP2 in a region in which the second and third isolation structures MS2 and MS3 are in contact with each other. The first isolation bent portion MS_BP1 may be disposed on the second level H2. Accordingly, the first isolation bent portion MS_BP1 may be disposed on a level higher than a level of the channel bent portion CH_BP. The first isolation bent portion MS_BP1 may be formed because a width of the upper surface of the first isolation structure MS1 is different from a width of the lower surface of the second isolation structure MS2. In an example embodiment, a width of an upper surface of the first isolation structure MS1 may be greater than a width of a lower surface of the second isolation structure MS2. The second isolation bent portion MS_BP2 may be disposed on the third level H3. Accordingly, the second isolation bent portion MS_BP2 may be disposed on a level lower than a level of the upper surface of each of the channel structures CH. The second isolation bent portion MS_BP2 may be formed because a width of the upper surface of the second isolation structure MS2 is different from a width of the lower surface of the third isolation structure MS3. In an example embodiment, the width of the upper surface of the second isolation structure MS2 may be narrower than the width of the lower surface of the third isolation structure MS3. Accordingly, the width of the first portion P1 may discontinuously change on a level on which the first and second isolation bent portions MS_BP1 and MS_BP2 are disposed.

The second portion P2 of the isolation structures MS may include a fourth isolation structure MS4 and a fifth isolation structure MS5 on the fourth isolation structure MS4. The fourth isolation structure MS4 may penetrate through the lower stack structure GS1, and the fifth isolation structure MS5 may penetrate through the upper stack structure GS2 and may be in contact with the upper surface of the fourth isolation structure MS4. The fourth and fifth isolation structures MS4 and MS5 may be integrally connected to each other. The upper surface of the fourth isolation structure MS4 and the lower surface of the fifth isolation structure MS5 may be in contact with each other on the second level H2 in the intermediate insulating layer 125.

In an example embodiment, the second portion P2 of the isolation structures MS may include the third isolation bent portion MS_BP3 in a region in which the fourth and fifth isolation structures MS4 and MS5 are in contact with each other. The third isolation bent portion MS_BP3 may be disposed on the second level H2, and may be formed because the width of the upper surface of the fourth isolation structure MS4 is different the width of the lower surface of the fifth isolation structure MS5. In an example embodiment, the width of the upper surface of the fourth isolation structure MS4 may be greater than the width of the lower surface of the fifth isolation structure MS5.

The first and fourth isolation structures MS1 and MS4 of the isolation structures MS may be integrally connected to each other in the Y-direction. The first and fourth isolation structures MS1 and MS4 may have inclined side surfaces of which a width may decrease from the upper surface disposed on the first level H1 toward the second substrate 101.

The second, and fifth isolation structures MS2, and MS5 of the isolation structures MS may be integrally connected to each other in the Y-direction on the first and fourth isolation structures MS1 and MS4 integrally connected to each other. The second and third isolation structures MS2 and MS3 may be formed by additionally forming an opening with respect to a trench formed in the same process of forming the fifth isolation structure MS5 and filling the opening with an insulating material.

In an example embodiment, the support pattern 185P of the upper support structure 185 may cover the capping insulating layer 181 and the second portion P2 of the isolation structures MS. An upper surface of the fourth isolation structure MS4 of the second portion P2 may be in contact with the support pattern 185P. The plurality of through regions 185OS of the upper support structure 185 may be filled with the third isolation structure MS3. The third isolation structure MS3 may be formed by additionally penetrating a portion of the upper region of the capping insulating layer 181 from the plurality of through regions 185OS and filling the penetrated region with an insulating material. Accordingly, the lower surface of the third isolation structure MS3 may be disposed on a third level lower than a level of the upper surface of the capping insulating layer 181.

Referring to FIG. 4A, the channel bent portion CH_BP of each of the channel structures CH may be disposed on the first level H1 lower than the second level H2 of the first and third isolation bent portions MS_BP1 and MS_BP3. The second isolation bent portion MS_BP2 may be disposed on the third level H3 lower than a level of the upper surface of the second channel structure CH2 and/or the upper surface of the capping insulating layer 181.

In an example embodiment, a barrier structure 160 disposed to surround the through wiring region TR on the second region R2 may be further included. The through wiring region TR may include a wiring structure for electrically connecting the memory cell structure CELL to the peripheral circuit structure PERI. The through wiring region TR may include through contact plugs 174 penetrating through the second region R2 and extending in the Z-direction, and an insulating region IR surrounding the through contact plugs 174. In example embodiments, the through wiring region TR may be referred to as a region within the barrier structure 160. For example, a single through-wiring region TR may be disposed in each memory block, but the number of the through-wiring regions TR, the size of the through-wiring region TR, the arrangement form of the through-wiring regions TR, and the shape of the through-wiring region TR may be varied in example embodiments. The isolation structures MS may not overlap the through wiring region TR and may be spaced apart from the through wiring region TR.

The insulating region IR may penetrate through the memory cell structure CELL and may be disposed in parallel with the second substrate 101 and the gate electrodes 130. In the insulating region IR, the gate electrode 130 may not extend or may not be disposed, and may include an insulating stack structure formed of an insulating material. The insulating region IR may include a substrate insulating layer 109 disposed on the same level as a level of the second substrate 101 and disposed in parallel to the second substrate 101, interlayer insulating layers 120 which may be second and third insulating layers alternately stacked on the upper surface of the and the second substrate 101, and sacrificial insulating layers 118.

The substrate insulating layer 109, which may be the first insulating layer, may be disposed in a region from which portions of the second substrate 101, the horizontal insulating layer 110, and the second horizontal conductive layer 104 are removed, and may be surrounded by the substrate 101, the horizontal insulating layer 110, and the second horizontal conductive layer 104. The lower surface of the substrate insulating layer 109 may be substantially coplanar with the lower surface of the second substrate 101 or may be disposed on a level lower than a level of the lower surface of the second substrate 101. Since the second insulating layer is formed by extending the interlayer insulating layers 120, the second insulating layer may be disposed on substantially the same level as a level of the interlayer insulating layers 120. The third insulating layer may include sacrificial insulating layers 118 and may be disposed on substantially the same level as a level of the gate electrodes 130, but an example embodiment thereof is not limited thereto.

The substrate insulating layer 109, the interlayer insulating layers 120, and the sacrificial insulating layers 118 included in the insulating region IR may be formed of an insulating material. For example, each of the substrate insulating layer 109, the interlayer insulating layers 120, and the sacrificial insulating layers 118 may include silicon oxide, silicon nitride, or silicon oxynitride.

The through contact plugs 174 may vertically penetrate through the entire insulating region IR and may extend perpendicularly to the upper surface of the second substrate 101, and may electrically connect the memory cell structure CELL to the circuit devices 220 of the peripheral circuit structure PERI. For example, the through contact plugs 174 may electrically connect the gate electrodes 130 and/or the channel structures CH of the memory cell structure CELL to the circuit devices 220 of the peripheral circuit structure PERI. The through contact plugs 174 may be connected to the wiring lines 188 in an upper portion, and may be connected to the circuit wiring lines 280, which may be a lower wiring structure, in the lower portion. The number of the through contact plugs 180, the form of the through contact plugs 180, and the shape of the through contact plugs 180 in the through wiring region TR may be varied in example embodiments. The through contact plugs 174 may include a conductive material, such as, for example, tungsten (W), copper (Cu), aluminum (Al), or the like.

The barrier structure 160 may be disposed to surround the through wiring region TR on the second region R2. In a plan diagram, the barrier structure 160 may include horizontal regions extending in parallel to the isolation structures MS extending in the X-direction and vertical regions extending in the Y-direction. In the example embodiment, the horizontal regions and the vertical regions may form a single closed curve, and the barrier structure 160 may be disposed in a slit having a rectangular ring or a shape similar thereto on a plane. The barrier structure 160 may prevent a material forming the gate electrodes 130 from flowing into the through wiring region TR during a process of manufacturing the semiconductor device.

Referring to FIGS. 1 and 3A together, the barrier structure 160 may be disposed on a boundary between the gate electrodes 130 and the sacrificial insulating layers 118. An external side surface of the barrier structure 160 may face the gate electrodes 130, and an internal side surface of the barrier structure 160 may face the sacrificial insulating layers 118. In example embodiments, the terms "external side surface" and "internal side surface" used in relation to the barrier structure 160 may refer to the side surface facing the external region of the barrier structure 160 and the side surface facing the internal region surrounded by the barrier structure 160, respectively.

Similar to the arrangement of the isolation structures MS on the second region R2, the barrier structure 160 may be disposed a region in which the second horizontal conductive layer 104 is in direct contact with the second substrate 101. Accordingly, the barrier structure 160 may penetrate through the second horizontal conductive layer 104 on a lower end, may be in contact with the second substrate 101 and may be spaced apart from the first horizontal conductive layer 102 and the horizontal insulating layer 110.

Referring to FIG. 4B, the barrier structure 160 may include a barrier filling insulating layer 164, a first barrier material layer 161 surrounding the barrier filling insulating layer 164, a second barrier material layer 162 surrounding the first barrier material layer 161 and a third barrier material layer 165 on the barrier filling insulating layer 164. The first barrier material layer 161 may be formed in an annular shape surrounding the barrier filling insulating layer 164, but in example embodiments, the first barrier material layer 161 may have a cylindrical shape or a prism shape without the barrier filling insulating layer 164. The second barrier material layer 162 may be disposed between the gate electrodes 130 or the sacrificial insulating layers 118 and the first barrier material layer 161. The third barrier material layer 165 may cover the upper surface of the barrier filling insulating layer 164 and a side surface of the third barrier material layer 165 may be surrounded by the first barrier material layer 161, but an example embodiment thereof is not limited thereto. The barrier filling insulating layer 164 may include the same insulating material as that of the channel filling insulating layer 144, such as, for example, silicon oxide. The first barrier material layer 161 may include the same material as a material of the channel layer 140, and may include, for example, a semiconductor material such as polycrystalline silicon or single crystal silicon. The second barrier material layer 162 may include the same material as a material of the dielectric layer 142, such as, for example, silicon oxide, silicon nitride, or a combination thereof. The second barrier material layer 162 may include three layers corresponding to the tunneling layer 142a, the charge storage layer 142b, and the blocking layer 142c. The third barrier material layer 165 may include the same material as a material of the conductive pad 145, such as, for example, doped polycrystalline silicon. This structure may be formed as the materials included in the channel structures CH are deposited in the trench formed by the same process of forming the trench corresponding to the isolation structures MS and remain without being removed through a subsequent process.

In an example embodiment, the barrier structure 160 may include a first barrier structure 160-1 and a second barrier structure 160-2 on the first barrier structure 160-1. The first barrier structure 160-1 may penetrate through the lower stack structure GS1 and may be in contact with the second substrate 101, and the second barrier structure 160-2 may penetrate through the upper stack structure GS2 and may be in contact with the upper surface of the first barrier structure 160-1. The upper surface of the first barrier structure 160-1 and the lower surface of the second barrier structure 160-2 may be in contact with each other on the second level H2. The first and second barrier structures 160-1 and 160-2 may be integrally connected to each other. The first barrier structure 160-1 may be disposed on substantially the same level as a level of the first and fourth isolation structures MS1 and MS4, which may be because the first barrier structure 160-1 is formed in a trench formed in the same process of forming the trench corresponding to the first and fourth isolation structures MS1 and MS4. The second barrier structure 160-2 may be disposed on substantially the same level as a level of the fifth isolation structure MS5, which may be because the second barrier structure 160-2 may be formed in the trench formed in the same process of forming the trench corresponding to the fifth isolation structure MS5.

In an example embodiment, the barrier structure 160 may include a barrier bent portion 160_BP in a region in which the first and second barrier structures 160-1 and 160-2 are in contact with each other. The barrier bent portion 160_BP may be disposed on the second level H2. The barrier bent portion 160_BP may be formed as the width of the upper surface of the first barrier structure 160-1 is greater than the width of the lower surface of the second barrier structure 160-2. Accordingly, the width of the barrier structure 160 may discontinuously change on a level on which the barrier bent portion 160_BP is disposed.

In an example embodiment, the upper support structure 185 may cover an upper surface of the barrier structure 160.

The memory cell structure CELL of the semiconductor device 100 according to example embodiments may further include dummy support structures 150. The dummy support structures 150 may be in the form of a hole penetrating through the stack structure GS, and may be spaced apart from each other while forming rows and columns in a portion of the first region R1 and the second region R2. In an example embodiment, the dummy support structures 150 may be configured as oval-shaped holes disposed in a region adjacent to the gate contact plug 191, but the arrangement of the dummy support structures 150 and the shape of the dummy support structures 150 are not limited thereto. The dummy support structures 150 may not be electrically connected to upper wiring structures or may not form a memory cell string differently from to the channel structures CH in the semiconductor device 100. As seen in FIG. 4B, the dummy support structures 150 may support from the channel structure CH from the second substrate 101 to the gate contact plug 191. The dummy support structures 150 may penetrate through the stack structure GS, the second horizontal conductive layer 104, and the horizontal insulating layer 110 in the Z-direction and may be in contact with the second substrate 101.

Each of the dummy support structures 150 may include a dummy vertical pillar 154, a first dummy material layer 151 surrounding the dummy vertical pillar 154, a second dummy material layer 152 surrounding the first dummy material layer 151, and a third dummy material layer 155 on the dummy vertical pillar 154. The first dummy material layer 151 may be formed in an annular shape surrounding the dummy vertical pillars 154, or in example embodiments, the first dummy material layer 151 may have a cylindrical or prismatic shape without the dummy vertical pillars 154. The second dummy material layer 152 may be disposed between the gate electrodes 130 and the first dummy material layer 151. The third dummy material layer 155 may cover an upper surface of the dummy vertical pillar 154 and may be surrounded by a side surface of the first dummy material layer 151, but an example embodiment thereof is not limited thereto. The dummy vertical pillars 154 may include the same insulating material as that of the channel filling insulating layer 144, such as, for example, silicon oxide. The first dummy material layer 151 may include the same material as a material of the channel layer 140, and may include, for example, a semiconductor material such as polycrystalline silicon or single crystal silicon. The second dummy material layer 152 may include the same material as a material of the dielectric layer 142, such as, for example, silicon oxide, silicon nitride, or a combination thereof. The second dummy material layer 152 may include three layers corresponding to the tunneling layer 142a, the charge storage layer 142b, and the blocking layer 142c. The third dummy material layer 155 may include the same material as a material of the conductive pad 145, such as, for example, doped polycrystalline silicon. This structure may be formed as the materials included in the channel structures CH are deposited together in the hole formed by the same process of forming the trench corresponding to the isolation structures MS and remain without being removed through a subsequent process.

In an example embodiment, each of the dummy support structures 150 may include a first dummy support structure 150-1 and a second dummy support structure 150-2 on the first dummy support structure 150-1. The first dummy support structure 150-1 may penetrate through the lower stack structure GS1 and may be in contact with the second substrate 101, and the second dummy support structure 150-2 may penetrate through the upper stack structure GS2 and may be in contact with the upper surface of the first dummy support structure 150-1. The upper surface of the first dummy support structure 150-1 and the lower surface of the second dummy support structure 150-2 may be in contact with each other on the second level H2. The first and second dummy support structures 150-1 and 150-2 may be integrally connected to each other. The first dummy support structure 150-1 may be disposed on substantially the same level as a level of the first and fourth isolation structures MS1 and MS4, which may be because the first dummy support structure 150-1 is formed in a hole formed in the same process of forming the trench corresponding to the first and fourth isolation structures MS1 and MS4. The second dummy support structure 150-2 may be disposed on substantially the same level as a level of the fifth isolation structure MS5, which may be because the second dummy support structure 150-2 may be formed in a hole formed in the same process of forming the trench corresponding to the fifth isolation structure MS5.

In an example embodiment, each of the dummy support structures 150 may include a dummy bent portion 150_BP in a region in which the first and second dummy support structures 150-1 and 150-2 may be in contact with each other. The dummy bent portion 150_BP may be disposed on the second level H2. The dummy bent portion 150_BP may be a structure formed as the width of the upper surface of the first dummy support structure 150-1 is greater than the width of the lower surface of the second dummy support structure 150-2. Accordingly, the width of each of the dummy support structures 150 may discontinuously change on the level on which the dummy bent portion 150_BP is disposed.

In an example embodiment, the upper support structure 185 may cover the upper surface of the dummy support structures 150.

As shown in FIG. 3A, for example, a first upper insulating layer 186 and a second upper insulating layer 187 may be stacked in sequence on the upper surface of the upper support structure 185. The upper insulating layers 186 and 187 may include an insulating material such as silicon oxide.

As illustrated in FIGS. 2 and 3A, the gate contact plug 191 may penetrate through the first upper insulating layer 187, the upper support structure 185, and the capping insulating layer 181 and may be connected to the gate electrodes 130 having an upper surface exposed upwardly among the gate electrodes 130 on the second region R2.

The wiring lines 192 and the wiring via 193 may form an upper wiring structure electrically connected to memory cells in the memory cell structure CELL. The wiring lines 192 may be electrically connected to, for example, through contact plugs 174, the gate electrodes 130, and the channel structures CH. The wiring via 193 may penetrate through the second upper insulating layer 187, and may electrically connect the wiring lines 192, the gate contact plug 191, the channel structures CH, and/or the through contact plugs 174 to each other. The number of contact plugs and wiring lines included in the wiring structure may be varied in example embodiments. The wiring lines 192 and the wiring via 193 may include a metal, such as, for example, tungsten (W), copper (Cu), aluminum (Al), or the like.

Figure 5:
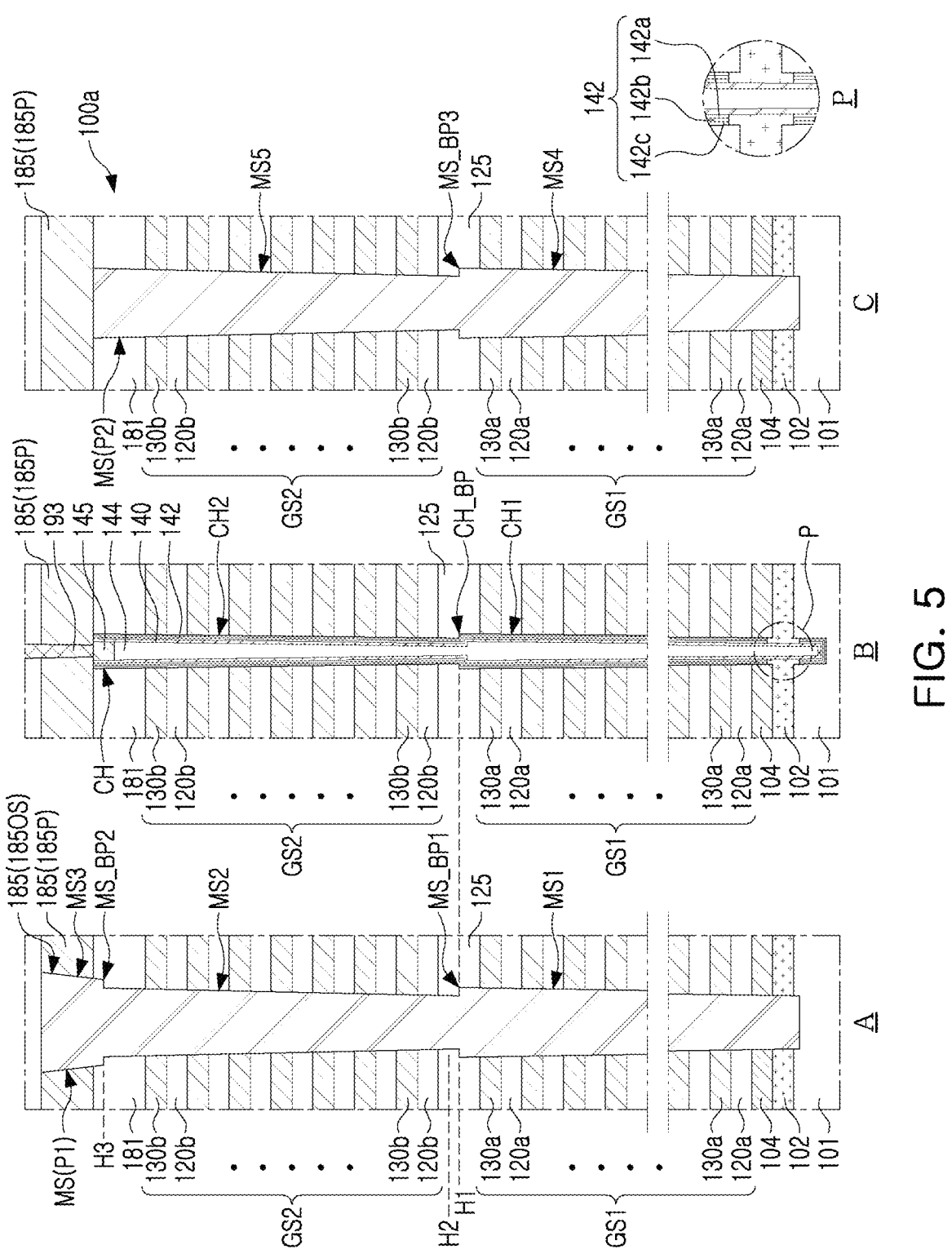
FIG. 5 is an enlarged diagram illustrating a portion of a semiconductor device according to an example embodiment of the present disclosure.

FIG. 5 is an enlarged cross-sectional diagram illustrating a portion of a semiconductor device 100a according to example embodiments, illustrating region "A," region "B," and region "C" in FIG. 3B.

Referring to FIG. 5, a semiconductor device 100a may include a structure of isolation structures MS different from that of the semiconductor device 100 in FIG. 4A.

Each of the isolation structures MS may include a first portion P1 overlapping the plurality of through regions 185OS in the Z-direction and a second portion P2 overlapping the support patterns 185P. Each of the isolation structures MS may have a form in which the first portion P1 and the second portion P2 are integrally connected to each other in the Y-direction.

The first portion P1 of the isolation structures MS may include a first isolation structure MS1 penetrating through the lower stack structure GS1, a second isolation structure MS2 penetrating through the upper stack structure GS2 and in contact with the first isolation structure MS1, and a third isolation structure MS3 penetrating through at least a portion of the capping insulating layer 181 and in contact with the second isolation structure MS2. The first to third isolation structures MS1, MS2, and MS3 may be integrally connected to each other.

The second portion P2 of the isolation structures MS may include a fourth isolation structure MS4 penetrating through the lower stack structure GS1 and a fifth isolation structure MS5 penetrating the upper stack structure GS2 and in contact with the fourth isolation structure MS4. The fourth and fifth isolation structures MS4 and MS5 may be integrally connected to each other.

The upper surface of the first isolation structure MS1 and the lower surface of the second isolation structure MS2 may be in contact with each other on a first level H1 in the intermediate insulating layer 125. That is, the upper surface of the first isolation structure MS1 may be disposed on a first level H1 substantially the same as a level of the upper surface of the first channel structure CH1. The upper surface of the fourth isolation structure MS4 and the lower surface of the fifth isolation structure MS5 may be in contact with each other on the first level H1. This structure may be formed as a sacrificial material is filled in the hole for forming the first channel structure CH1, a planarization process is performed, and a trench for forming first isolation structure MS1 is directly formed without additionally forming an intermediate insulating layer 125. Alternatively, this structure may be formed by simultaneously forming the hole of the first channel structure CH1 and the trench of the first isolation structure MS1.

Figure 6:
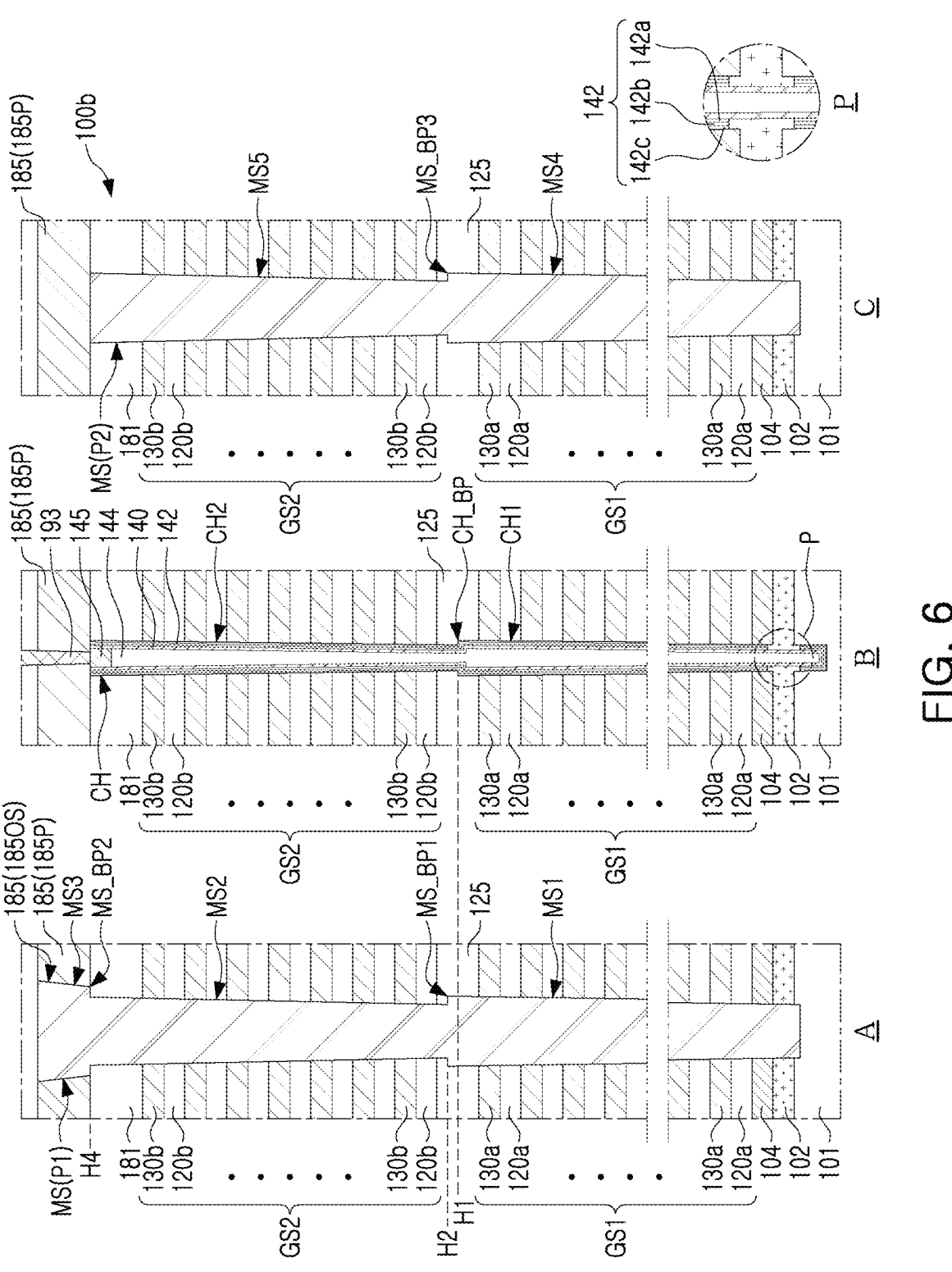
FIG. 6 is an enlarged diagram illustrating a portion of a semiconductor device according to an example embodiment of the present disclosure.

FIG. 6 is an enlarged cross-sectional diagram illustrating a portion of a semiconductor device 100b according to example embodiments, illustrating region "A," region "B," and region "C" in FIG. 3B.

Referring to FIG. 6, the semiconductor device 100b may have the same structure as the semiconductor device 100 in FIG. 4A other than the second isolation structure MS2 and the third isolation structure MS3.

The first portion P1 of the isolation structures MS may include first to third isolation structures MS1, MS2, and MS3 integrally formed. The upper surface of the second isolation structure MS2 and the lower surface of the third isolation structure MS3 may be in contact with the upper surface of the capping insulating layer 181 on substantially the same level, a fourth level H4. This structure may be formed as the opening may be formed by etching only a region corresponding to the plurality of through regions 185OS of the upper support structure 185 and the opening is not etched with respect to the capping insulating layer 181 in the process of forming the opening for forming the third isolation structure MS3.

Figure 7:
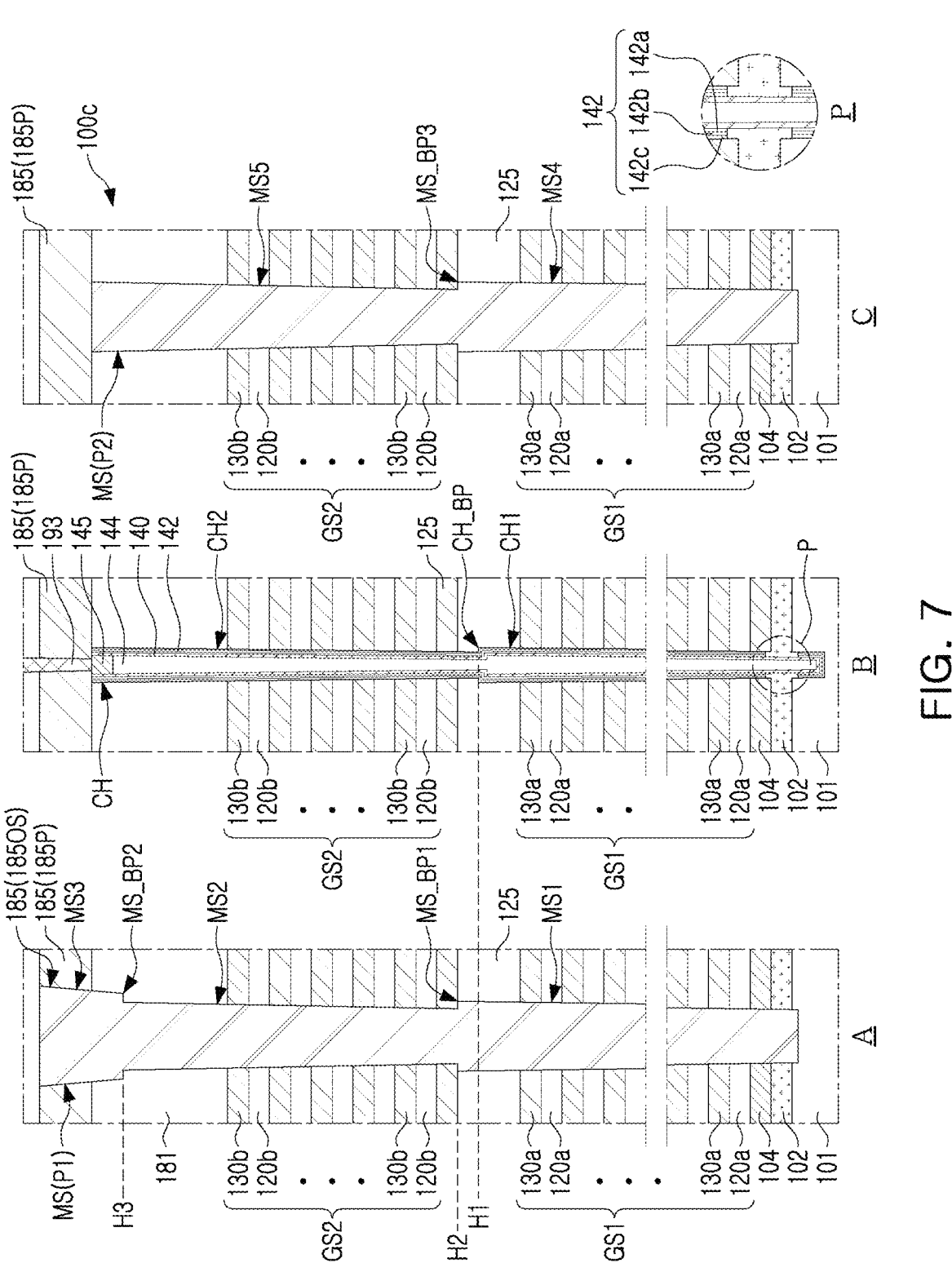
FIG. 7 is an enlarged diagram illustrating a portion of a semiconductor device according to an example embodiment of the present disclosure.

FIG. 7 is an enlarged cross-sectional diagram illustrating a portion a semiconductor device 100c according to example embodiments. FIG. 7 is an enlarged diagram illustrating region "A," region "B," and region "C" in FIG. 3B.

Referring to FIG. 7, in the semiconductor device 100c, the stack structure GS may have a form different from the example in FIG. 4A. The second gate electrode 130b, not the interlayer insulating layer 120, may be disposed on the lowermost portion of the upper stack structure GS2.

Upper surfaces of the first and fourth isolation structures MS1 and MS4 may be in contact with the lowermost second gate electrode 130b of the upper stack structure GS2. The lower surface of the lowermost second gate electrode 130b may be disposed on a second level H2 on which the first and second isolation structures MS1 and MS2 are in contact with each other or the fourth and fifth isolation structures MS4 and MS5 are in contact with each other. In an example embodiment, the lowermost second gate electrode 130b of the upper stack structure GS2 may be in contact with the first isolation bent portion MS_BP1.

Figure 8:
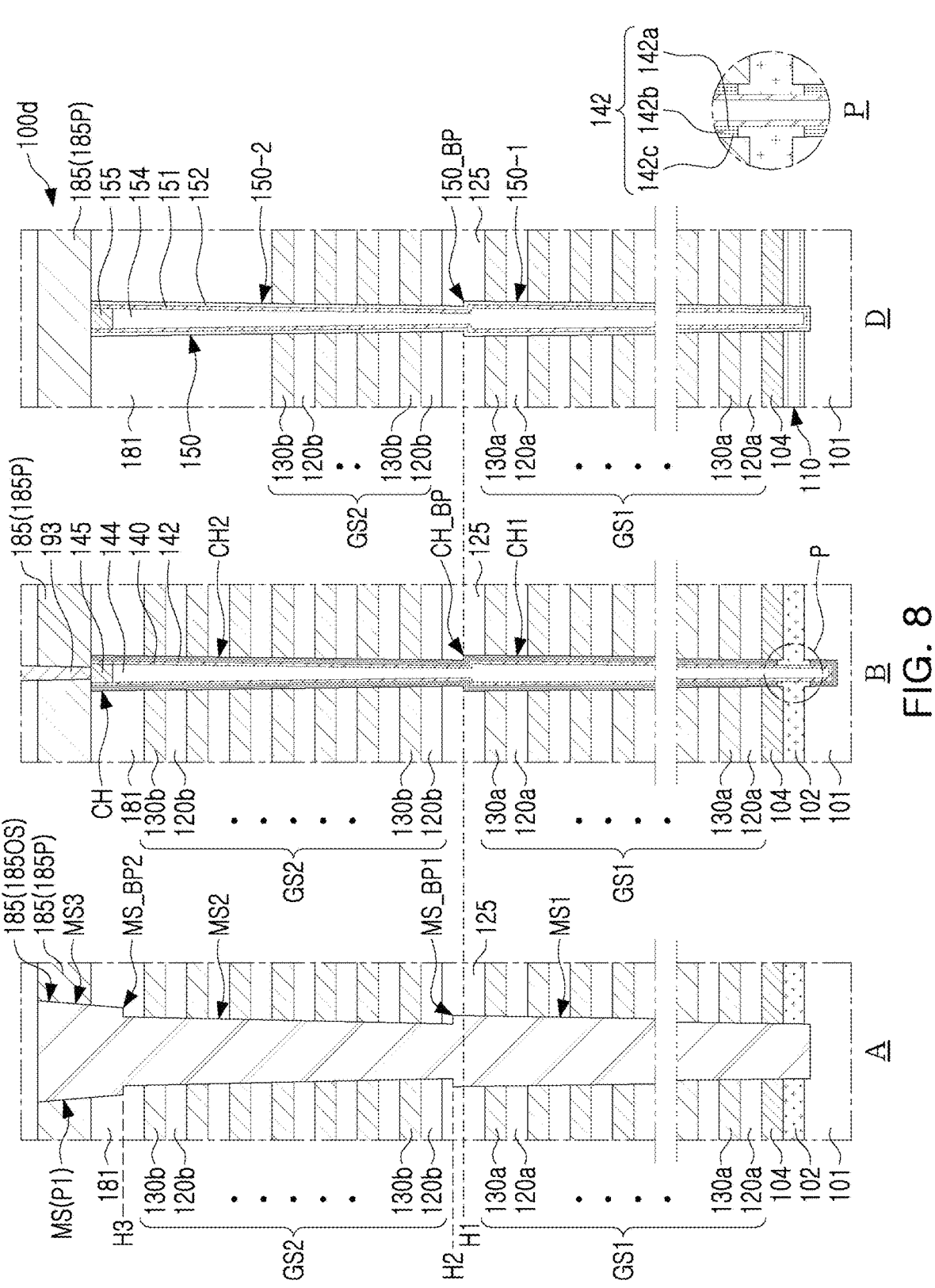
FIG. 8 is an enlarged diagram illustrating a portion of a semiconductor device according to an example embodiment of the present disclosure.

FIG. 8 is an enlarged cross-sectional diagram illustrating a portion of a semiconductor device 100d according to example embodiments, illustrating region "A," region "B" in FIG. 3B, and region "D" in FIG. 3C.

Referring to FIG. 8, the semiconductor device 100d may include a structure of dummy support structures 150 different from the example in FIG. 4B.

In an example embodiment, each of the dummy support structures 150 may include a first dummy support structure 150-1 penetrating through the lower stack structure GS1 and a second dummy support structure 150-2 penetrating through the upper stack structure GS2 and in contact with the dummy support structure 150-1. The first and second dummy support structures 150-1 and 150-2 may be integrally connected to each other. The upper surface of the first dummy support structure 150-1 and the lower surface of the second dummy support structure 150-2 may be in contact with each other on a first level H1. The first dummy support structure 150-1 may be disposed on substantially the same level as a level of the first channel structure CH1, and the second dummy support structure 150-2 may be disposed on a substantially same level as a level of the second channel structure CH2. This may be because, differently from to FIG. 4B, a hole for forming the dummy support structures 150 may be formed in the same process as a hole for forming the channel structures CH.

In an example embodiment, each of the dummy support structures 150 may include a dummy bent portion 150_BP in a region in which the first and second dummy support structures 150-1 and 150-2 are in contact with each other. The dummy bent portion 150_BP may be disposed on the first level H1. The dummy bent portion 150_BP may be formed as the width of the upper surface of the first dummy support structure 150-1 is greater than the width of the lower surface of the second dummy support structure 150-2. Accordingly, the width of each of the dummy support structures 150 may discontinuously change on the level on which the dummy bent portion 150_BP is disposed.

Each of the dummy support structures 150 may include a dummy vertical pillar 154, a first dummy material layer 151 surrounding the dummy vertical pillar 154, a second dummy material layer surrounding the first dummy material layer 151, and a third dummy material layer 155 on the dummy vertical pillar 154. The first dummy material layer 151 may be formed in an annular shape surrounding the dummy vertical pillars 154. The second dummy material layer 152 may be disposed between the gate electrodes 130 and the first dummy material layer 151. The third dummy material layer 155 may cover an upper surface of the dummy vertical pillar 154 and may be surrounded by a side surface of the first dummy material layer 151, but an example embodiment thereof is not limited thereto. The dummy vertical pillars 154 may include the same insulating material as that of the channel filling insulating layer 144, such as, for example, silicon oxide. The first dummy material layer 151 may include the same material as a material of the channel layer 140, and may include, for example, a semiconductor material such as polycrystalline silicon or single crystal silicon. The second dummy material layer 152 may include the same material as a material of the dielectric layer 142, such as, for example, silicon oxide, silicon nitride, or a combination thereof. The second dummy material layer 152 may include three layers corresponding to the tunneling layer 142a, the charge storage layer 142b, and the blocking layer 142c. The third dummy material layer 155 may include the same material as a material of the conductive pad 145, such as, for example, doped polycrystalline silicon.

Figure 9:
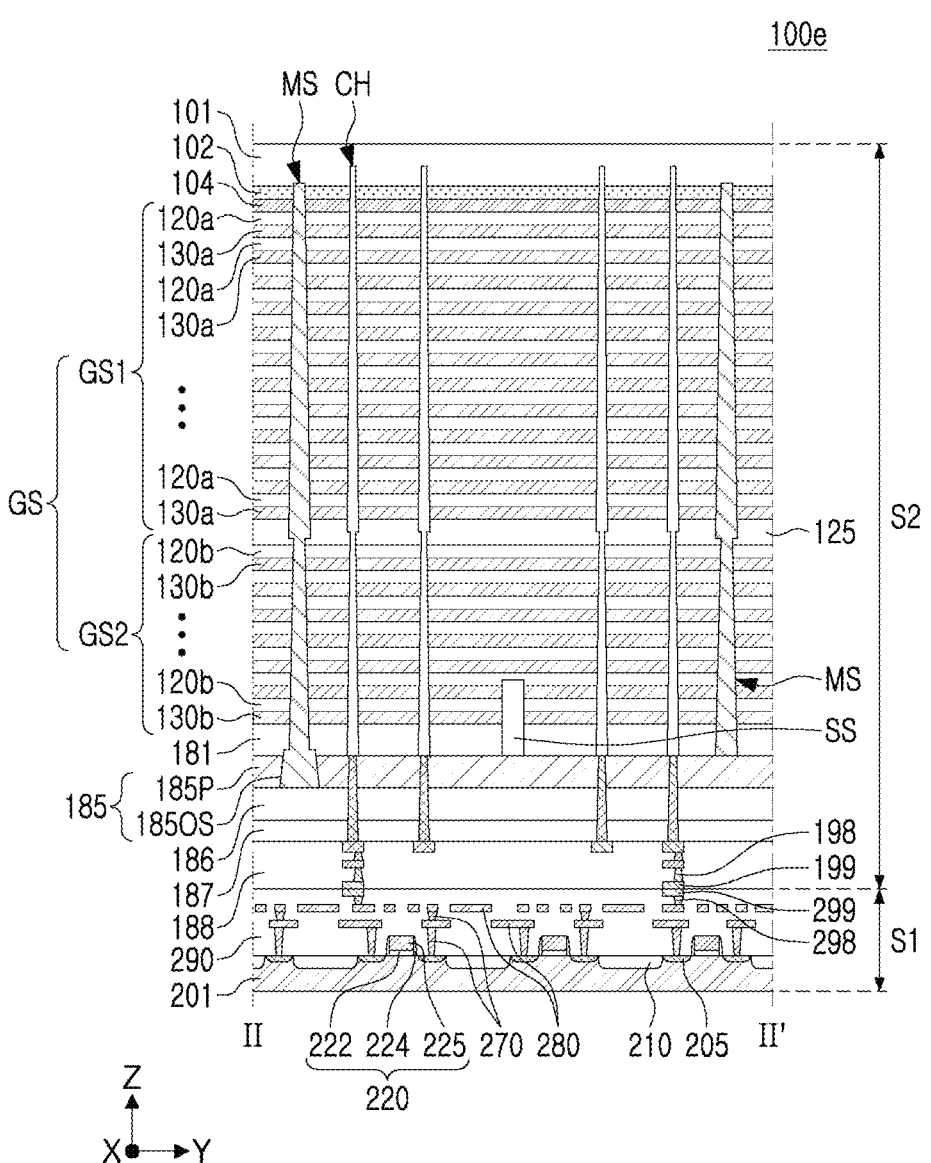
FIG. 9 is a cross-sectional diagram illustrating a semiconductor device according to an example embodiment of the present disclosure.

FIG. 9 is a cross-sectional diagram illustrating a semiconductor device 100e according to example embodiments, taken along line II-II' in FIG. 2.

Referring to FIG. 9, the semiconductor device 100e may include a first structure S1 and a second structure S2 bonded by a wafer bonding method.

The description of the peripheral circuit structure PERI described above with reference to FIGS. 1 to 4B may be applied to the first structure S1. However, the first structure S1 may further include first bonding vias 298 and first bonding pads 299, which may be a bonding structure. The first bonding vias 298 may be disposed on uppermost circuit wiring lines 280 and may be connected to the circuit wiring lines 280. At least a portion of the first bonding pads 299 may be connected to the first bonding vias 298 on the first bonding vias 298. The first bonding pads 299 may be connected to the second bonding pads 199 of the second structure S2. The first bonding pads 299 may provide an electrical connection path according to the bonding the first structure S1 to the second structure S2 together with the second bonding pads 199. The first bonding vias 298 and the first bonding pads 299 may include a conductive material, such as, for example, copper (Cu).

As for the second structure S2, the descriptions described with reference to FIGS. 1 to 4B may be applied unless otherwise indicated. The second structure S2 may further include second bonding vias 198, which are bonding structures connected to the wiring lines 192, and second bonding pads 199. In example embodiments, the second structure S2 may further include a protective layer covering the upper surface of the second substrate 101.

The second bonding vias 198 and the second bonding pads 199 may be disposed below the wiring lines 192. The second bonding vias 198 may be connected to the wiring lines 192 and the second bonding pads 199, and the second bonding pads 199 may be bonded to the first bonding pads 299 of the first structure S1. The second bonding vias 198 and the second bonding pads 199 may include a conductive material, such as, for example, copper (Cu).

The first structure S1 and the second structure S2 may be bonded to each other by copper (Cu)-copper (Cu) bonding by first bonding pads 299 and second bonding pads 199. In addition to the copper (Cu)-copper (Cu) bonding, the first structure S1 and the second structure S2 may be bonded by dielectric-dielectric bonding as well. The dielectric-dielectric bonding may be bonding by dielectric layers forming a portion of each of the peripheral region insulating layer 290 and the upper insulating layers 186 and 187, and surrounding each of the first bonding pads 299 and the second bonding pads 199. Accordingly, the first structure S1 and the second structure S2 may be bonded without an adhesive layer.

Figure 13A:
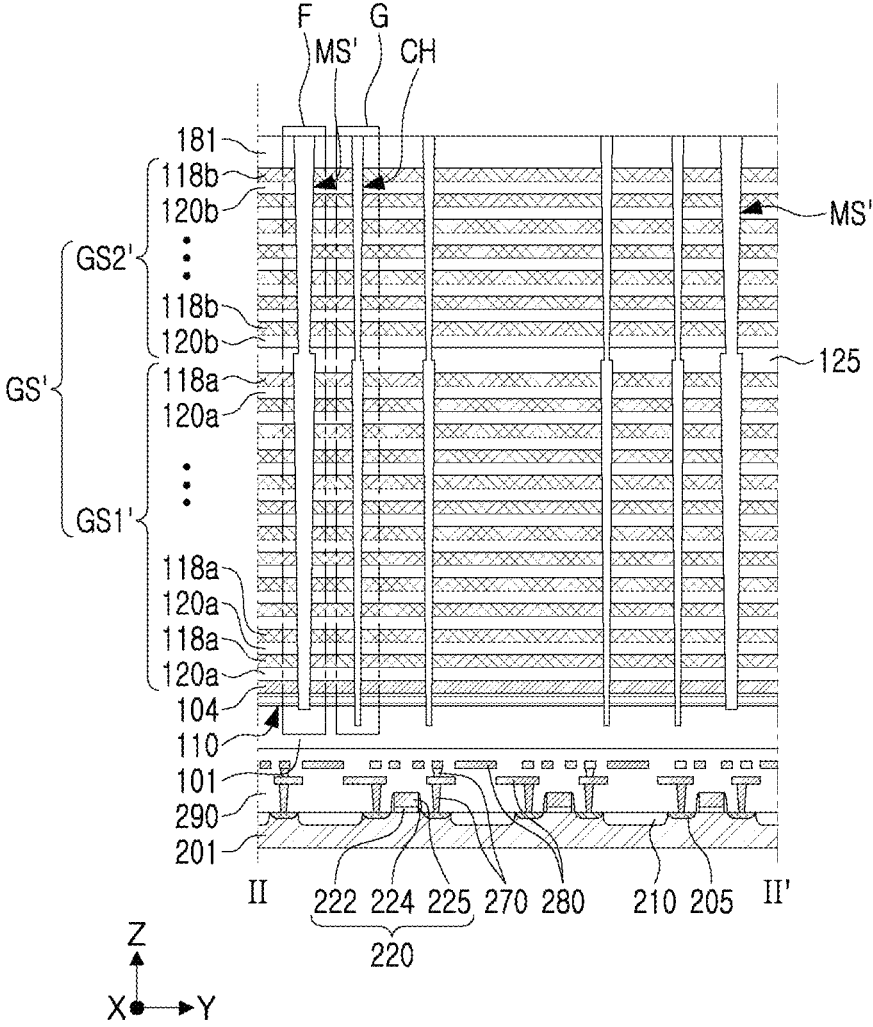
Figure 13B:
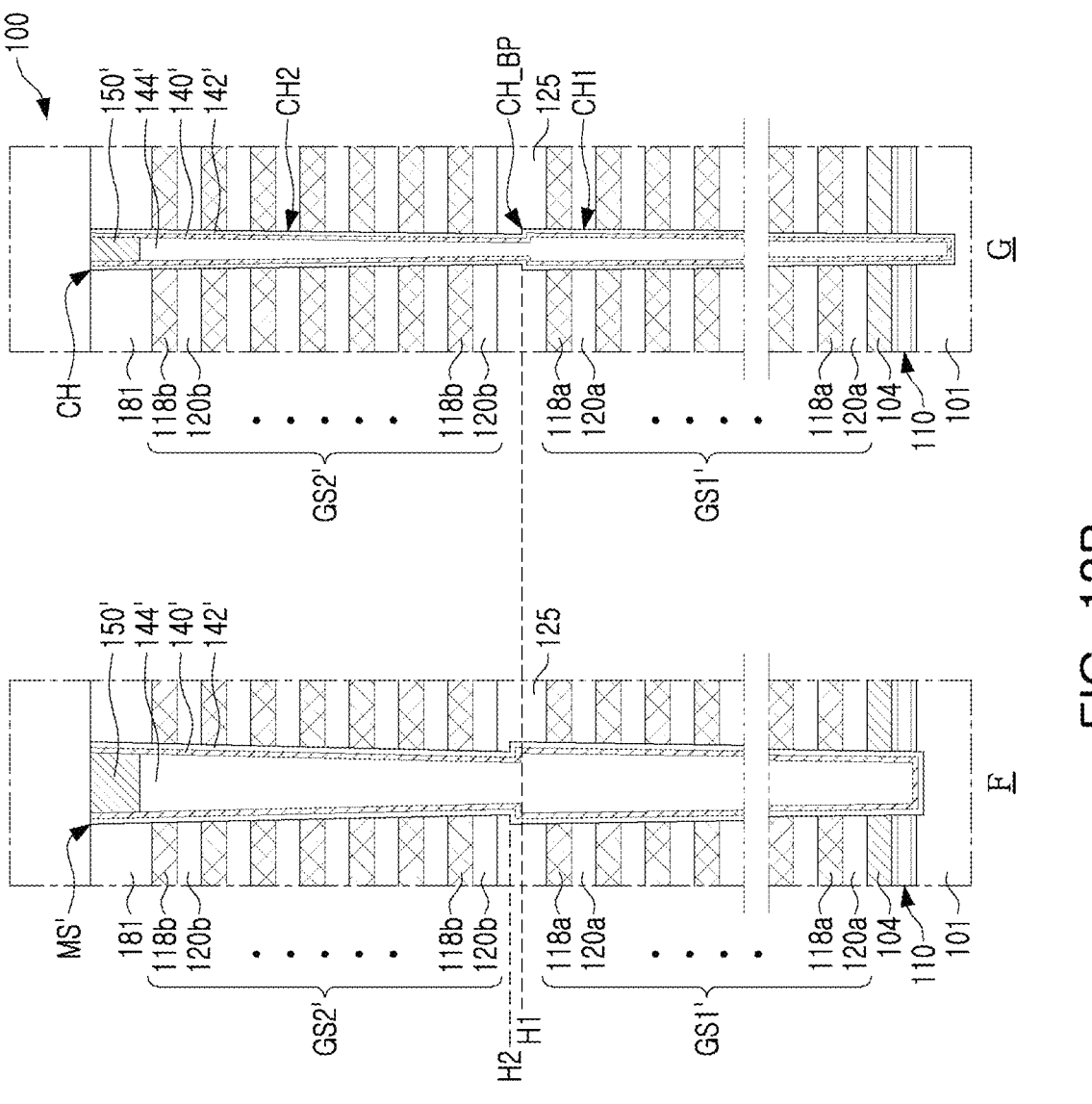
Figure 14:
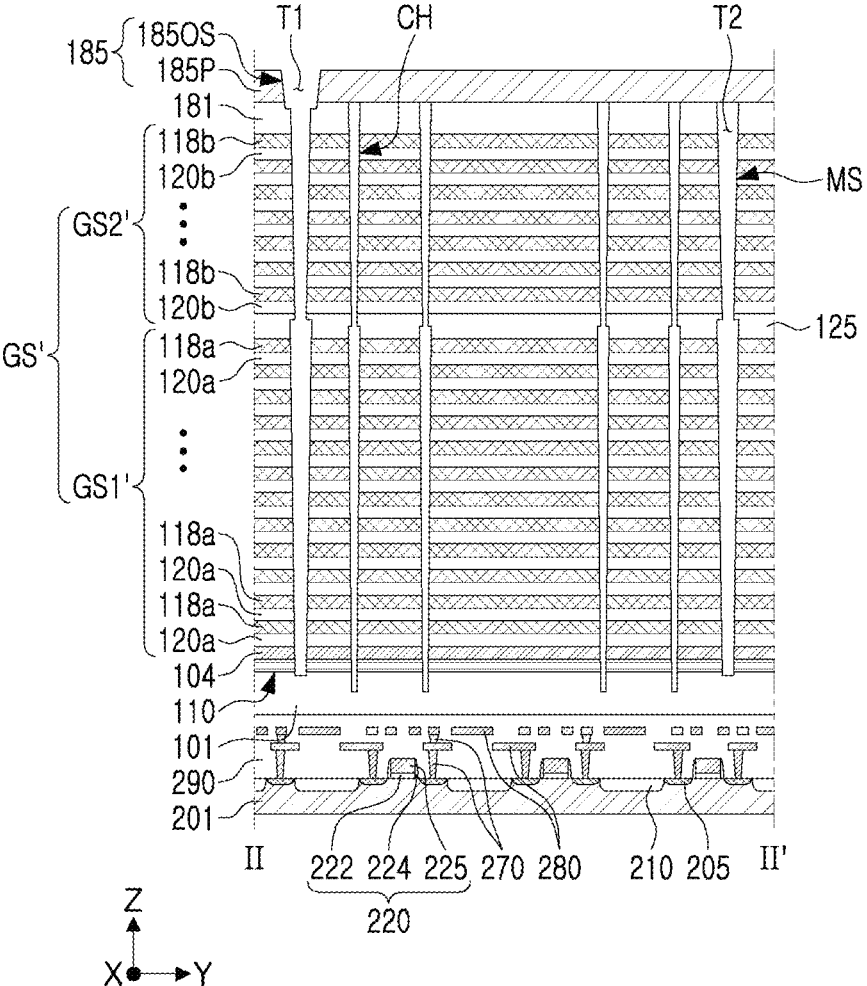
Figure 15A:
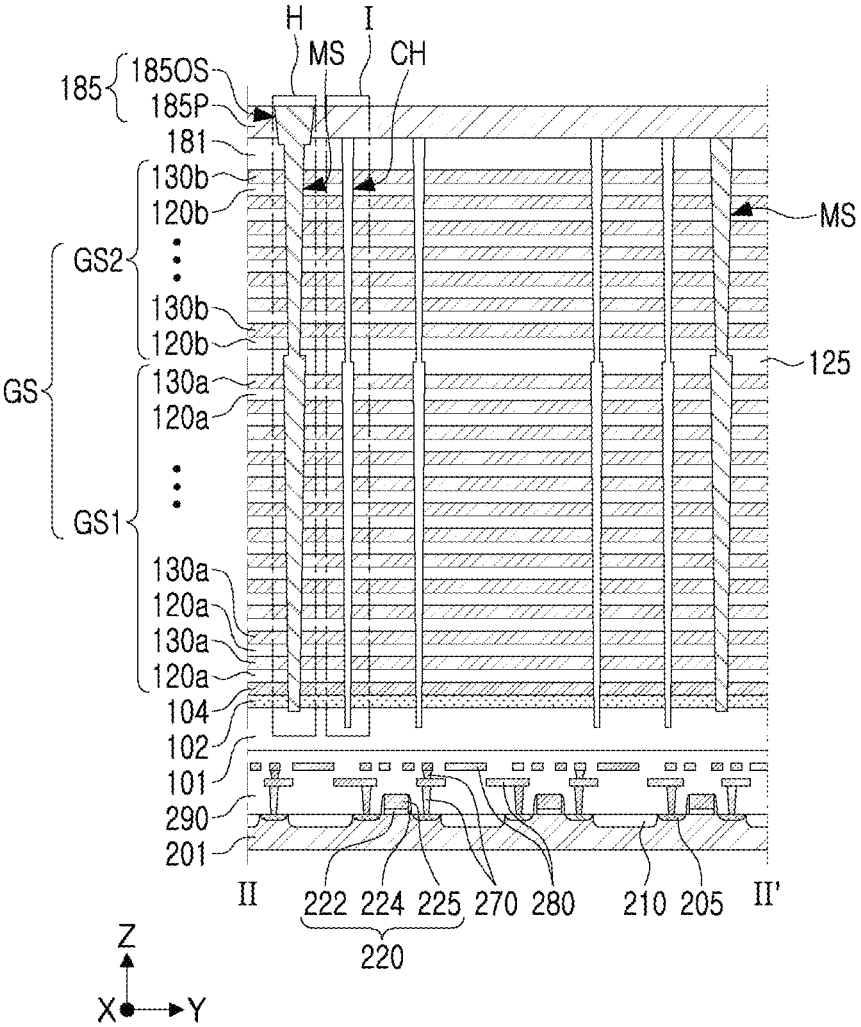
Figure 15B:
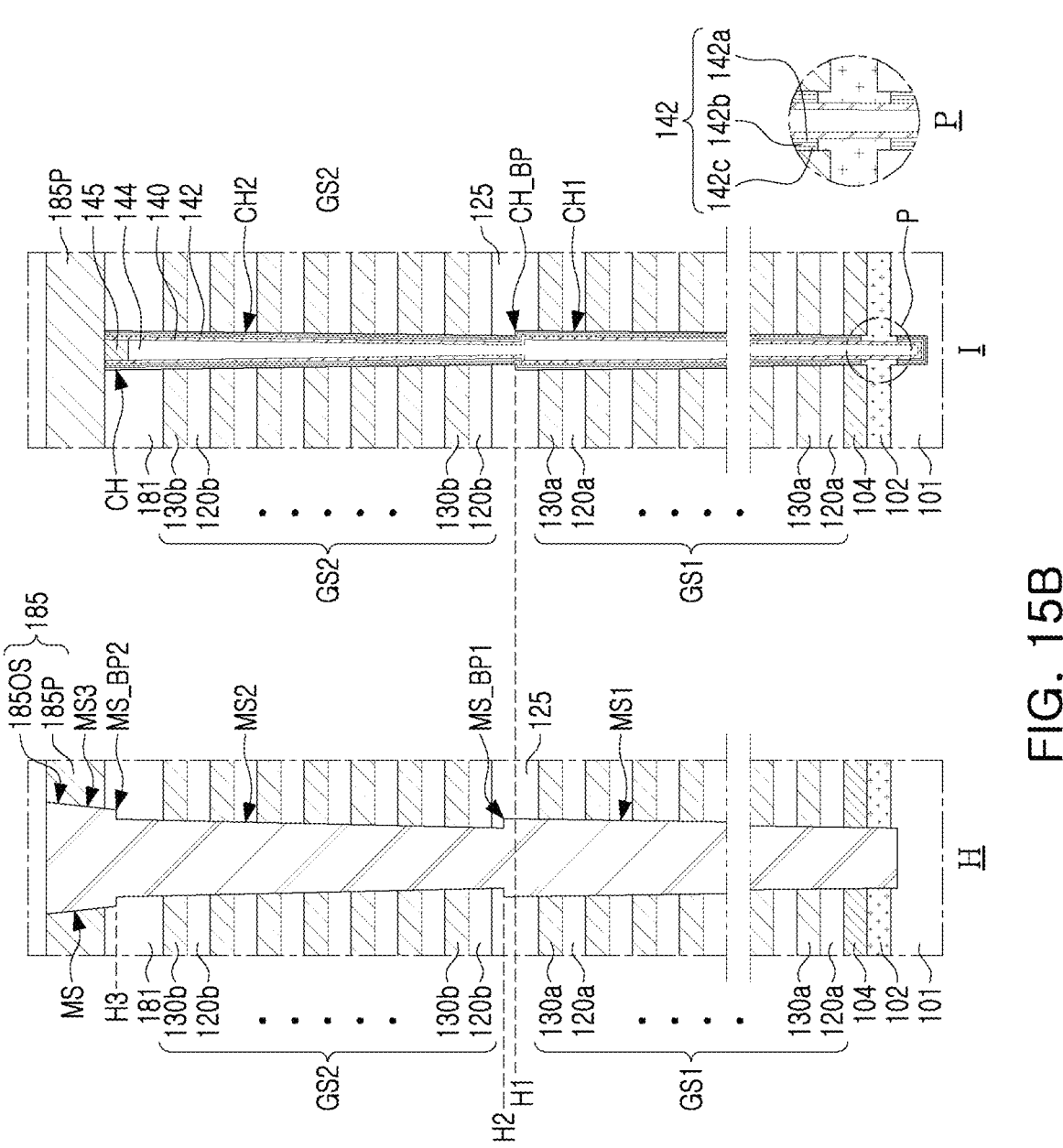

FIGS. 10 to 15B are cross-sectional diagrams and enlarged diagrams illustrating a method of manufacturing the semiconductor device 100 according to example embodiments. FIGS. 10, 11, 12, 13A, 14, and 15A illustrate a region corresponding to a cross-sectional diagram taken along line II-II' in FIG. 2, and FIG. 13B is an enlarged diagram illustrating regions "F" and "G," and FIG. 15B is an enlarged diagram illustrating regions "H" and "I" in FIG. 15A.

Figure 10:
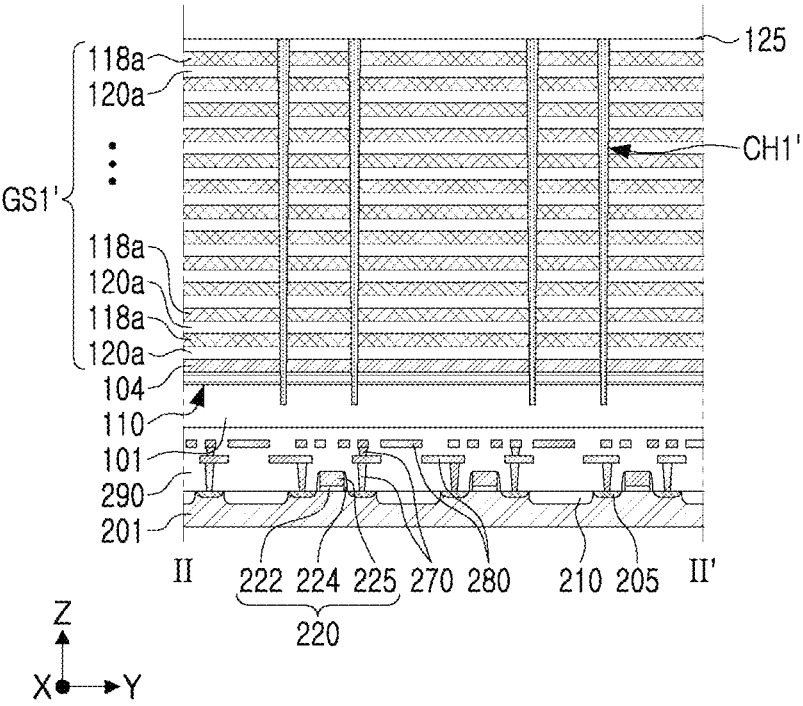
FIGS. 10 to 15B are cross-sectional diagrams and enlarged diagrams illustrating a method of manufacturing a semiconductor device according to an example embodiment of the present disclosure.

Referring to FIG. 10, a peripheral circuit structure PERI including circuit devices 220 and lower wiring structures may be formed on a first substrate 201, and a second substrate 101 on which the cell structure CELL is provided, a horizontal insulating layer 110, a second horizontal conductive layer 104, and a substrate insulating layer 109 may be formed, the first sacrificial insulating layers 118*a* and the first interlayer insulating layers 120*a* may be alternately stacked, and a preliminary first channel structure CH1' may be formed.

First, the device isolation layers 210 may be formed in the first substrate 201, and the circuit gate dielectric layer 222 and the circuit gate electrode 225 may be formed in sequence on the first substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but an example embodiment thereof is not limited thereto. Thereafter, a spacer layer 224 and source/drain regions 205 may be formed on both sidewalls of the circuit gate dielectric layer 222 and the circuit gate electrode 225. In example embodiments, the spacer layer 224 may include a plurality of layers. Thereafter, the source/drain regions 205 may be formed by performing an ion implantation process.

The circuit contact plugs 270 of the lower wiring structures may be formed by partially forming the peripheral region insulating layer 290, removing a portion thereof by etching, and filling a conductive material. The circuit wiring lines 280 may be formed by, for example, depositing a conductive material and patterning the material.

The peripheral region insulating layer 290 may include a plurality of insulating layers. A portion of the peripheral region insulating layer 290 may be formed in each process of forming the lower wiring structures, and a portion thereof may be formed on the uppermost circuit wiring line 280, thereby covering the circuit devices 220 and the lower wiring structures.

Thereafter, the second substrate 101 may be formed on the peripheral region insulating layer 290. The second substrate 101 may be formed of, for example, polycrystalline silicon, and may be formed by a CVD process. Polycrystalline silicon included in the second substrate 101 may include impurities.

The first to third horizontal insulating layers included in the horizontal insulating layer 110 may be stacked in sequence on the second substrate 101. The horizontal insulating layer 110 may be partially replaced with the first horizontal conductive layer 102 in FIG. 2B through a subsequent process. The first and third horizontal insulating layers may include a material different from that of the second horizontal insulating layer. For example, the first and third horizontal insulating layers may be formed of the same material as a material of the interlayer insulating layers 120, and the second horizontal insulating layer may be formed of the same material as a material of the sacrificial insulating layers 118. The horizontal insulating layer 110 may be removed by a patterning process in a portion of regions.

The second horizontal conductive layer 104 may be formed on the horizontal insulating layer 110, and may be in contact with the second substrate 101 in a region from which the horizontal insulating layer 110 is removed. Accordingly, the second horizontal conductive layer 104 may be bent along end portions of the horizontal insulating layer 110, may cover the ends, and may extend to the second substrate 101.

The substrate insulating layer 109 may be formed by removing a portion of second substrate 101, the horizontal insulating layer 110, and the second horizontal conductive layer 104 from the region corresponding to the through wiring region TR (see FIG. 3A) and filling an insulating material. The substrate insulating layer 109 may be formed throughout the entire region of the through wiring region TR or may be formed to be smaller than the through wiring region TR. After the insulating material is filled, a planarization process may be further performed using a chemical mechanical polishing (CMP) process. Accordingly, the upper surface of the substrate insulating layer 109 may be substantially coplanar with the upper surface of the second horizontal conductive layer 104.

Thereafter, the first sacrificial insulating layers 118*a* and the first interlayer insulating layers 120*a* may be alternately stacked. The first sacrificial insulating layers 118*a* may be partially replaced with the first gate electrodes 130*a* (see FIG. 3A) through a subsequent process. The first sacrificial insulating layers 118*a* may be formed of a material different from that of the first interlayer insulating layers 120*a*, and may be etched with etch selectivity with respect to the first interlayer insulating layers 120*a* under specific etching conditions. For example, the first interlayer insulating layer 120*a* may be formed of at least one of silicon oxide and silicon nitride, and the first sacrificial insulating layers 118*a* may be formed of a material selected from silicon, silicon oxide, silicon carbide, and silicon nitride, which may be different from the material of the first interlayer insulating layer 120*a*. In example embodiments, the thicknesses of the first interlayer insulating layers 120*a* may not be the same. The thicknesses of the first interlayer insulating layers 120*a* and the first sacrificial insulating layers 118 and the number of layers included in the first interlayer insulating layers 120*a* and 118 may be varied from the illustrated examples. The first sacrificial insulating layers 118*a* and the first interlayer insulating layers 120*a* may form a lower preliminary stack structure GS1'.

Thereafter, a portion of the intermediate insulating layer 125 may be deposited on the lower preliminary stack structure GS1', and a first preliminary channel structure CH1' penetrating through the intermediate insulating layer 125 and the lower preliminary stack structure GS1' may be formed. The first preliminary channel structure CH1' may be formed by filling a sacrificial material in a hole penetrating through the intermediate insulating layer 125 and the lower preliminary stack structure GS1'. The sacrificial material may include a semiconductor material such as polycrystalline silicon. In an example embodiment, a spacer layer such as silicon oxide may be formed between the sacrificial material and the lower preliminary stack structure GS1'. However, in example embodiments, the sacrificial material and the spacer layer may include a metal material such as tungsten (W) and titanium nitride (TiN).

The first preliminary channel structure CH1' may penetrate through the horizontal insulating layer 110, may be in contact with the second substrate 101, and may have an upper surface disposed on a first level H1 (see FIG. 4A).

Figure 11:
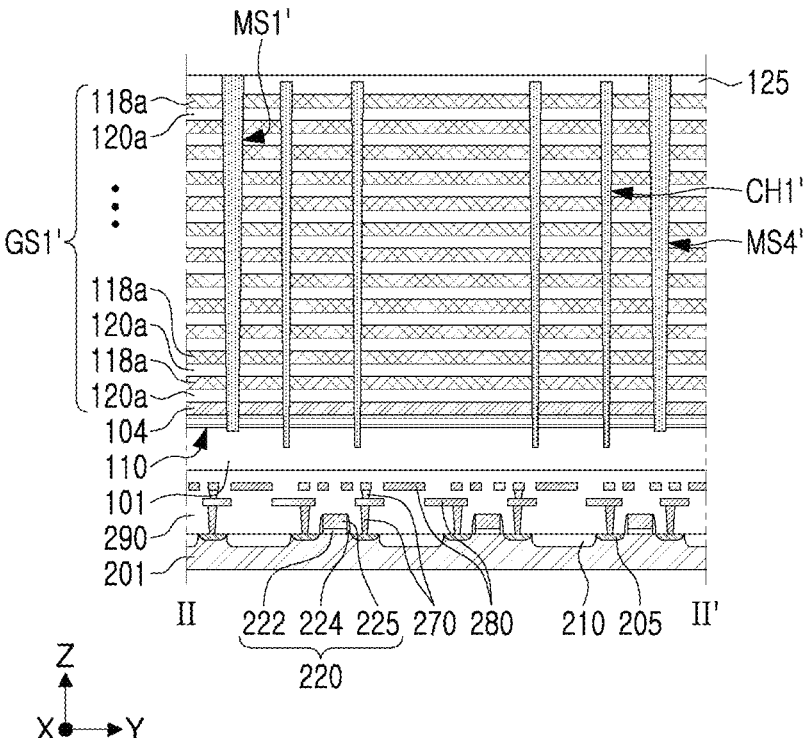

Referring to FIG. 11, first and fourth preliminary isolation structures MS1' and MS4' may be formed.

After additionally depositing the intermediate insulating layer 125 to cover the upper surface of the first preliminary channel structure CH1', the first and Fourth preliminary isolation structures MS1' and MS4' may be formed. The first and fourth preliminary isolation structures MS1' and MS4' may be formed by filling a sacrificial material in a trench extending in the X-direction. The first preliminary isolation structure MS1' may be a preliminary isolation structure of a portion overlapping the plurality of through regions 185OS (see FIGS. 2 and 3A) of the upper support structure 185 (see FIGS. 2 and 3A) formed through a subsequent process in the Z-direction. The fourth preliminary isolation structure MS4' may be a preliminary isolation structure of a portion overlapping the support pattern 185P (see FIGS. 2 and 3A) of the upper support structure 185 formed through a subsequent process in the Z-direction. The first preliminary isolation structure MS1' and the fourth preliminary isolation structure MS4' may be preliminary isolation structures extending integrally along the X-direction.

The first and fourth preliminary isolation structures MS1' MS4' may have upper surfaces disposed on a second level H2 (see FIG. 4A) higher than the first level H1.

A trench for forming the first and fourth preliminary isolation structures MS1' and MS4' may be preferentially formed, and the isolation structures MS (FIG. 4A) may be formed by performing a subsequent process, such that a semiconductor device of which process difficulty may be addressed and production yield may be improved.

In this process, a first preliminary dummy support structure and a first preliminary barrier structure may be formed together with the first and fourth preliminary isolation structures MS1' and MS4'. That is, the first preliminary dummy support structure and the first dummy support structure may be formed by forming a hole and a trench in regions corresponding to the first dummy support structure 150-1 and the first barrier structure 160-1 in FIG. 4B, respectively, and filling a sacrificial material therein. Accordingly, the number of processes of manufacturing the dummy support structure 150 (see FIG. 4B) and the barrier structure 160 (see FIG. 4B) may be relatively reduced, thereby providing a semiconductor device having improved productivity. The first preliminary dummy support structure and the first preliminary barrier structure may have upper surfaces disposed on a second level H2 higher than the first level H1.

Figure 12:
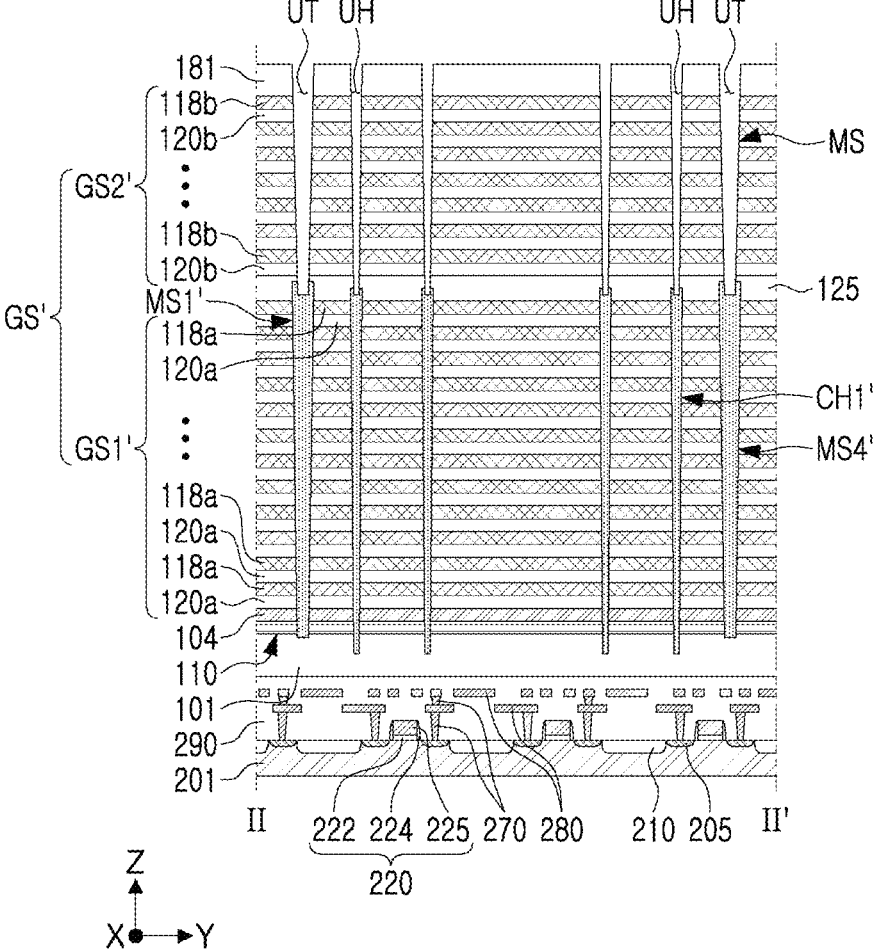

Referring to FIG. 12, the second sacrificial insulating layers 118*b* and the second interlayer insulating layers 120*b* may be stacked in sequence, and an upper hole exposing the upper surface of the first preliminary channel structure CH1' UH) and an upper trench UT exposing upper surfaces of the first and fourth preliminary isolation structures MS1' and MS4' may be simultaneously formed.

A portion of the intermediate insulating layer 125 may be additionally deposited, and second interlayer insulating layers 120*b* and second sacrificial insulating layers 118*b* may be alternately stacked on the intermediate insulating layer 125. The second interlayer insulating layers 120*b* may include the same material as a material of the first interlayer insulating layers 120*a*, and the second sacrificial insulating layers 118*b* may include the same material as a material of the first sacrificial insulating layers 120*b*. Accordingly, the second sacrificial insulating layers 120*b* may be formed of a material different from that of the second interlayer insulating layers 120*b*, and may be formed of a material etched with etch selectivity with respect to the second interlayer insulating layers 120*b* under a specific etching condition. The second sacrificial insulating layers 118*b* and the second interlayer insulating layers 120*b* may form an upper preliminary stack structure GS2'. In an example embodiment, the number of the first sacrificial insulating layers 118*a* of the lower preliminary stack structure GS1' may be greater than the number of the second sacrificial insulating layers 118*b* of the upper preliminary stack structure GS2'. However, an example embodiment thereof is not limited thereto.

Thereafter, a capping insulating layer 181 covering the upper preliminary stack structure GS2' may be formed, and an upper hole UH exposing the upper surface of the structure CH1' and an upper trench UT exposing the upper surface of the first and fourth preliminary isolation structures MS1' and MS4' may be simultaneously formed by anisotropically etching the upper and lower preliminary stack structures GS1' and GS2'. In an example embodiment, each of the upper hole UH and the upper trench UT may be recessed from the first preliminary channel structure CH1' and the first and fourth preliminary isolation structures MS1' and MS4' by a desired and/or alternatively predetermined depth. However, in example embodiments, the upper hole UH and/or the upper trench UT may be in contact with the first preliminary channel structure CH1' and the first and fourth preliminary isolation structures MS1' and MS4' without being recessed into the first preliminary channel structure CH1' and the first and fourth preliminary isolation structures MS1' and MS4'.

The lower surface of the upper hole UH may have a narrower width than the upper surface of the first preliminary channel structure CH1'. A lower surface of the upper trench UT may have a narrower width than an upper surface of the first and fourth preliminary isolation structures MS1' MS4'.

In this process, a hole or a trench exposing the first preliminary dummy support structure and the first preliminary barrier structure may be formed together. Accordingly, the upper surface of the first preliminary dummy support structure and the upper surface of the first preliminary barrier structure may be exposed. A lower surface of the hole penetrating through the first preliminary dummy support structure may have a width narrower than an upper surface of the first preliminary dummy support structure. A lower surface of the trench penetrating the first preliminary barrier structure may have a width narrower than the upper surfaces of the first and fourth preliminary isolation structures MS1' and MS4'.

Referring to FIGS. 13A and 13B, the first preliminary channel structure CH1' and the first and fourth preliminary isolation structures MS1' and MS4' may be removed and the channel structure CH may be formed.

The first preliminary channel structure CH1' exposed by the hole H may be removed through an etching process. In an example embodiment, the first and fourth preliminary isolation structures MS1' and MS4' exposed by the upper trench UT may be removed together through the etching process. However, in example embodiments, the first and fourth preliminary isolation structures MS1' and MS4' may be removed by performing a separate process.

Thereafter, the channel structure CH may be formed by depositing the dielectric layer 142, the channel layer 140, and the channel filling insulating layer 144 in sequence in the lower hole formed by removing the upper hole UH and the first preliminary channel structure CH1', partially etching the upper region of the channel filling insulating layer 144, and forming the conductive pad 145.

The channel structure CH may include a first channel structure CH1 and a second channel structure CH2. The channel structure CH may include the channel bent portion CH_BP due to a difference in width between the lower surface of the upper hole UH and the upper surface of the first preliminary channel structure CH1'. The first and second channel structures CH1 and CH2 may be distinct from each other based on the level on which the channel bent portion CH_BP is disposed, and may be integrally connected to each other.

In this process, the dummy structures MS' including a dummy dielectric layer 142', a channel layer 140', a dummy channel filling insulating layer 144', and a dummy conductive pad 145 corresponding to the dielectric layer 142, the channel layer 140, the channel filling insulating layer 144, and the conductive pad 145 may be formed together.

In this process, the first preliminary dummy support structure and the first preliminary barrier structure may be removed together with the first preliminary channel structure CH1', and materials included in the channel structure CH may be formed together, thereby forming a dummy support structure 150 (see FIG. 4B) and a barrier structure 160 (see FIG. 4B). Accordingly, the dummy support structure 150 may include the second dummy material layer 152 (see FIG. 4B), a first dummy material layer 151 (see FIG. 4B), a dummy vertical pillar 154 (see FIG. 4B), and a third dummy material layer 155 (see FIG. 4B) corresponding to the dielectric layer 142, the channel layer 140, the channel filling insulating layer 144, and the conductive pad 145. Also, the barrier structure 160 may include a second barrier material layer 162 (see FIG. 4B), a second barrier material layer 161 (see FIG. 4B), a barrier filling insulating layer 164 (see FIG. 4B), and a third barrier material layer 165 (see FIG. 4B) corresponding to the dielectric layer 142, the channel layer 140, the channel filling insulating layer 144, and the conductive pad 145 (see FIG. 4B).

The dummy support structure 150 and the barrier structure 160 may include a dummy bent portion 150_BP (see FIG. 4B) and a barrier bent portion 160_BP (see FIG. 4B) due to a difference in width between the upper surface of the first preliminary dummy support structure and the lower surface of a hole penetrating therethrough or a difference in width between the upper surface of the first preliminary barrier structure and the lower surface of the trench penetrating therethrough. The dummy bent portion 150_BP and the barrier bent portion 160_BP may be disposed on the second level H2 and may be disposed on a level higher than a level of the channel bent portion CH_BP.

Referring to FIG. 14, trenches T1 and T2 may be formed by forming an upper support structure 185 including a plurality of through regions 185OS, and removing the sacrificial structures exposed through the plurality of through regions 185OS.

First, an upper preliminary support structure covering the capping insulating layer 181 and the channel structure CH may be formed. The upper preliminary support structure may include an insulating material such as silicon oxide, silicon nitride, silicon oxynitride, or tetraethyl orthosilicate (TEOS). Thereafter, an opening penetrating the upper preliminary support structure may be formed, thereby forming the upper support structure 185 having the plurality of through regions 185OS and the support pattern 185P. The opening may be formed by removing a portion of the capping insulating layer 181 and the sacrificial structure together with the upper preliminary support structure, and accordingly, a region partially recessed into the capping insulating layer 181 may be formed.

Thereafter, the trenches T1 and T2 may be formed by removing the dummy structures MS' exposed through the opening. The trenches T1 and T2 may include regions corresponding to the dummy structures MS'. The trenches T1 and T2 may include a first trench T1 overlapping the plurality of through regions 185OS in the Z-direction and a second trench T2, and the first and second trenches T1 and T2 may be integrally connected to each other in the X-direction. The first trench T1 may include the opening.

The first trench T1 may include a first isolation bent portion MS_BP1 (see FIG. 15B) formed on a level within the intermediate insulating layer 125, and a second isolation bent portion MS_BP2 (see FIG. 15B) formed on a level within the capping insulating layer 181 by the opening. The second trench T2 may include a third isolation bent portion MS_BP3 (see FIG. 15B) disposed on the same level as a level of the first isolation bent portion MS_BP1 on a level in the intermediate insulating layer 125. The first and third isolation bent portions MS_BP1 and MS_BP3 may be connected to each other. The first and third isolation bent portions MS_BP1 and MS_BP3 may be disposed on a level higher than a level of the channel bent portion CH_BP (see FIG. 15B).

Referring to FIGS. 15A and 15B, a first horizontal conductive layer 102 may be formed, first and second gate electrodes 130*a* and 130*b* may be formed, and an isolation structure MS may be formed in the trenches T1 and T2.

First, while sacrificial spacer layers are formed in the trenches T1 and T2, the second horizontal insulating layer may be exposed by an etch-back process. The exposed second horizontal sacrificial layer may be selectively removed, and the upper and lower first and third horizontal insulating layers may be removed. During the removal process of the horizontal insulating layer 110, a portion of the dielectric layer 142 exposed in the region from which the second horizontal insulating layer is removed may also be removed. The first horizontal conductive layer 102 may be formed by depositing a conductive material in the region in which the horizontal insulating layer 110 has been removed, and the sacrificial spacer layers may be removed from the trenches T1 and T2.

In an example embodiment, the horizontal insulating layer 110 may be exposed by the trenches T1 and T2 on the first region R1 of the second substrate 101, or may not be exposed as the horizontal insulating layer 110 is spaced apart from the trenches T1 and T2 on the second region R2. A second horizontal conductive layer 104 may fill the space between the spaced spaces. Accordingly, the horizontal insulating layer 110 may be replaced with the first horizontal conductive layer 102 on the first region R1 and may remain on the second region R2.

Thereafter, tunnel portions may be formed by removing the first and second sacrificial insulating layers 118*a* and 118*b* exposed through the trenches T1 and T2, and the first and second gate electrodes 130*a* and 130*b* may be formed by filling the tunnel portions with a conductive material. The first and second sacrificial insulating layers 118*a* and 118*b* may be selectively removed with respect to the first and second interlayer insulating layers 120*a* and 120*b* using, for example, wet etching. The conductive material filling the tunnel portions may include a metal, polycrystalline silicon, or a metal silicide material.

The isolation structure MS may be formed by forming the first and second gate electrodes 130*a* and 130*b*, removing the conductive material deposited in the trenches T1 and T2 through an additional process, and filling an insulating material. Accordingly, the isolation structure MS filling the trenches T1 and T2 including the plurality of through regions 185OS may be formed.

In an example embodiment, the insulating material of the isolation structure MS may further extend in a direction toward the horizontal conductive layer 102 on the level on which the horizontal conductive layer 102 is disposed on the first region R1 of the second substrate 101, such that the isolation structure MS may have a protruding shape, but an example embodiment thereof is not limited thereto. The insulating material may include silicon oxide, silicon nitride, silicon oxynitride, or a high-k material. The isolation structure MS may include a single material layer, or may include a plurality of insulating material layers in example embodiments.

Thereafter, referring to FIGS. 1 to 4B, upper insulating layers 186 and 187 may be formed, and a wiring via 193 and wiring lines 192 may be formed.

A first upper insulating layer 186 covering the upper support structure 185 and the isolation structure MS may be formed, and a gate contact plug 191 penetrating the first upper insulating layer 186 and in contact with the first and second gate electrodes 130a and 130b may be formed. The gate contact plug 191 may be in contact with portions of the first and second gate electrodes 130a and 130b of which upper portions are exposed on the second region R2.

A second upper insulating layer 187 covering the gate contact plug 191 and the first upper insulating layer 186 may be formed, and via holes penetrating through the second upper insulating layer 187 may be formed. The via holes may expose upper surfaces of the gate contact plug 191 and/or the channel structures CH. A wiring via 193A may be formed by filling a conductive material in the via holes, and wiring lines 192 in contact with the wiring via 193 may be formed. In example embodiments, the wiring via 193 and the wiring lines 192 may be integrally formed.

Figure 16:
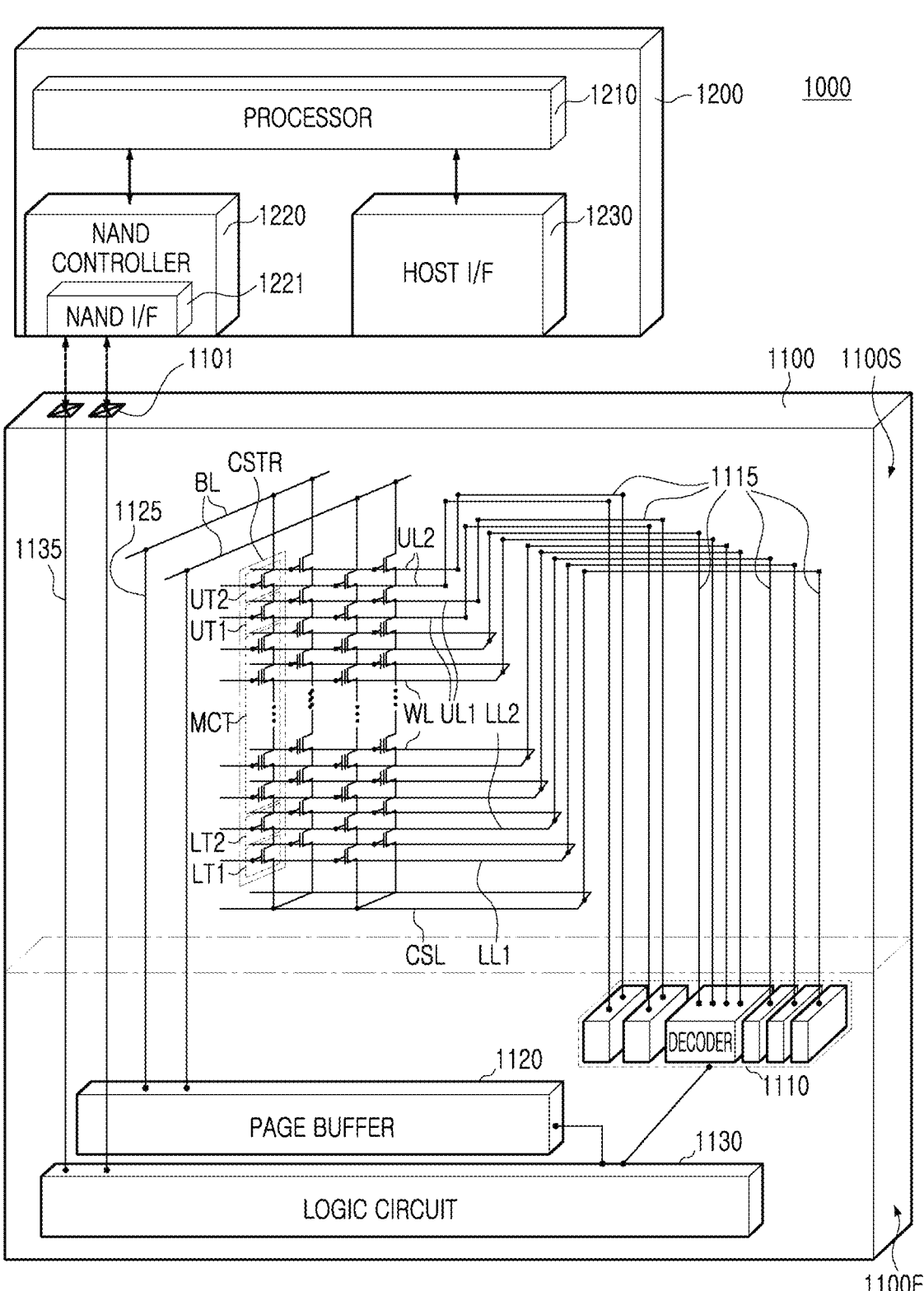
FIG. 16 is a diagram illustrating a data storage system including a semiconductor device according to an example embodiment of the present disclosure.

FIG. 16 is a diagram illustrating a data storage system including a semiconductor device according to example embodiments.

Referring to FIG. 16, the data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive device (SSD) including one or a plurality of semiconductor devices 1100, a universal serial bus (USB), a computing system, a medical device, or a communication device.

The semiconductor device 1100 may be implemented as a non-volatile memory device, such as, for example, the NAND flash memory device described above with reference to FIGS. 1 to 9. The semiconductor device 1100 may include a first structure 1100F and a second structure 1100S on the first structure 1100F. In example embodiments, the first structure 1100F may be disposed on the side of the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, a common source line CSL, word lines WL, first and second gate upper lines UL1 and UL2, first and second gate lower lines LL1 and LL2 and memory cell strings CSTR disposed between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used in an erase operation for erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection wires 1115 extending from the first structure 1100F to the second structure 1100S. The bit lines BL may be electrically connected to the page buffer 1120 through second connection wires 1125 extending from the first structure 110F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1000.

The processor 1210 may control overall operation of the data storage system 1000 including the controller 1200. The processor 1210 may operate according to a desired and/or alternatively predetermined firmware, and may access the semiconductor device 1100 by controlling the NAND controller 1220. The NAND controller 1220 may include a NAND interface 1221 processing communication with the semiconductor device 1100. Through the NAND interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command from an external host is received through the host interface 1230, the processor 1210 may control the semiconductor device 1100 in response to the control command.

Figure 17:
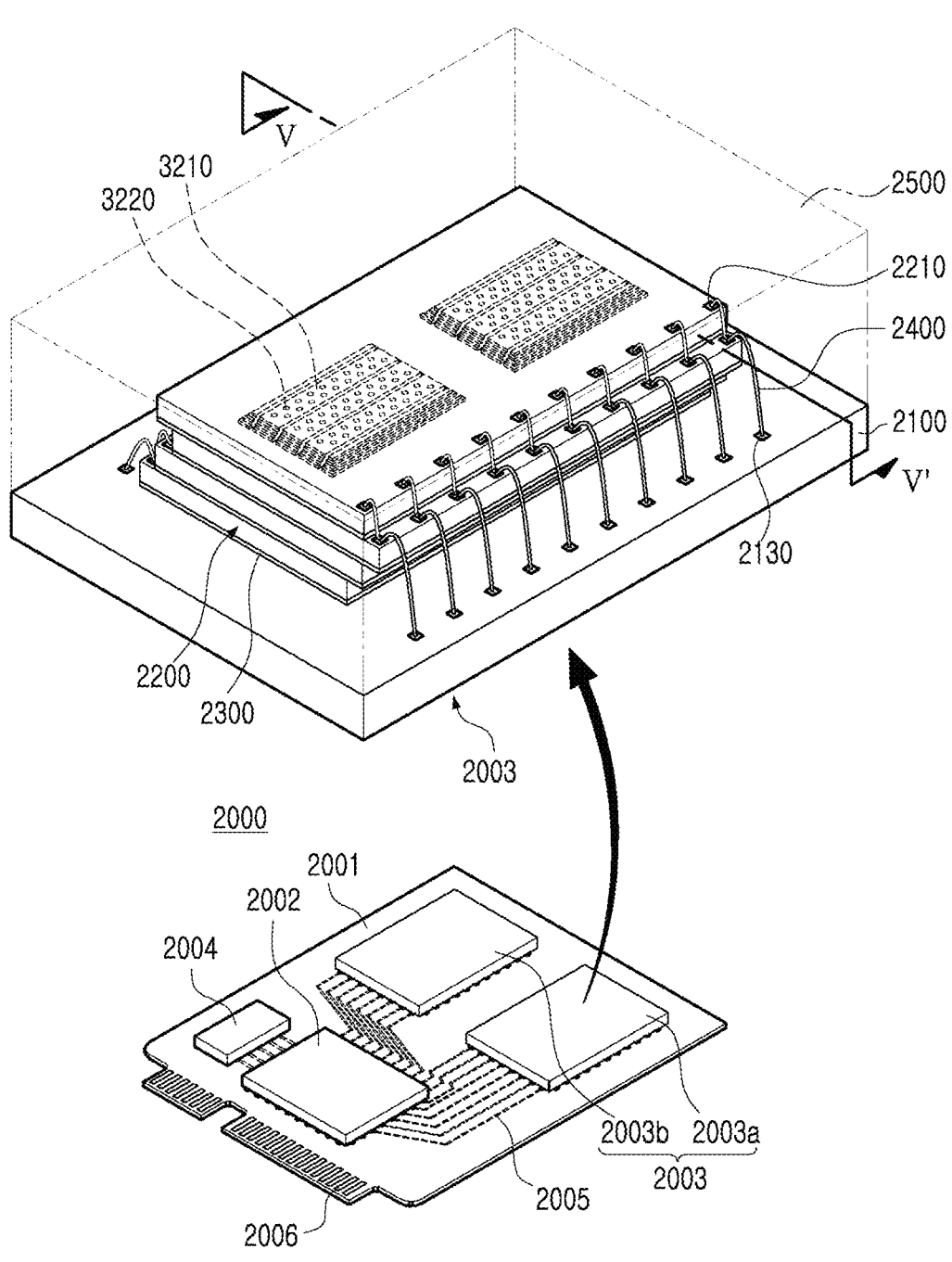
FIG. 17 is a perspective diagram illustrating a data storage system including a semiconductor device according to an example embodiment of the present disclosure.

FIG. 17 is a perspective diagram illustrating a data storage system including a semiconductor device according to an example embodiment.

Referring to FIG. 17, a data storage system 2000 in an example embodiment may include a main board 2001, a controller 2002 mounted on the main board 2001, one or more semiconductor packages 2003, and a DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between the data storage system 2000 and the external host. In example embodiments, the data storage system 2000 may communicate with an external host according to one of interfaces from among universal serial bus (USB), peripheral component interconnect express (PCI-Express), serial advanced technology attachment (SATA), M-Phy for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the data storage system 2000.

The DRAM 2004 may be configured as a buffer memory for alleviating a difference in speeds between the semiconductor package 2003, which is a data storage space, and an external host. The DRAM 2004 included in the data storage system 2000 may operate as a cache memory, and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 16. Each of the semiconductor chips 2200 may include gate stack structures 3210 and channel structures 3220. Each of the semiconductor chips 2200 may include the semiconductor device described above with reference to FIGS. 1 to 9.

In example embodiments, the connection structure 2400 may be configured as a bonding wire electrically connecting the input/output pad 2210 to the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through-electrode (TSV) instead of the connection structure 2400 of a bonding wire method.

In example embodiments, the controller 2002 and the semiconductor chips 2200 may be included in a single package. In an example embodiment, the controller 2002 and the semiconductor chips 2200 may be mounted on a separate interposer substrate different from the main substrate 2001, and the controller 2002 and the semiconductor chips 2200 may be connected to each other wiring formed on the interposer substrate.

Figure 18:
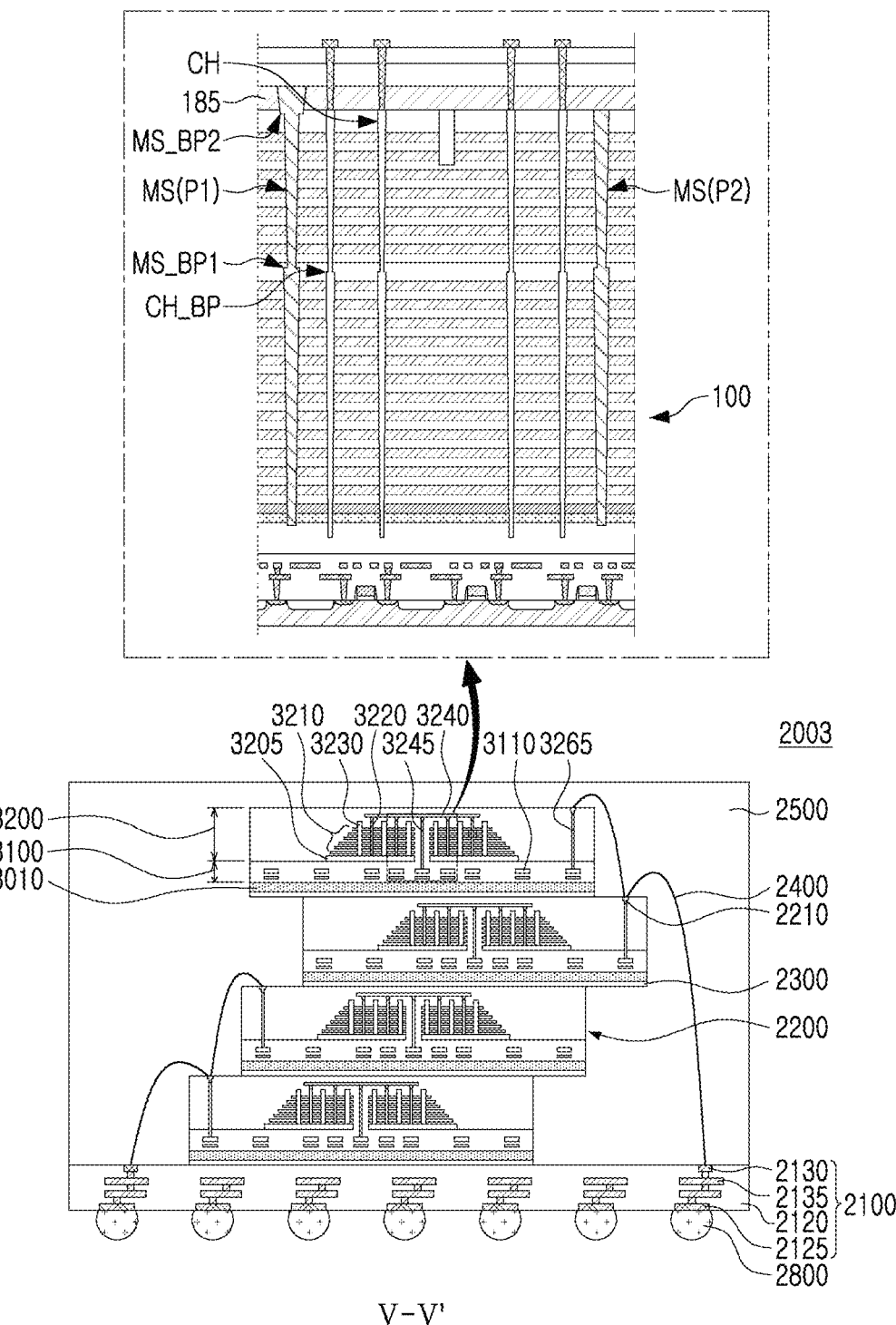
FIG. 18 is a cross-sectional diagram illustrating a semiconductor package according to an example embodiment of the present disclosure.

FIG. 18 is a cross-sectional diagram illustrating a semiconductor package according to an example embodiment, illustrating an example embodiment of the semiconductor package 2003 take along line V-V' in FIG. 17.

Referring to FIG. 18, in the semiconductor package 2003, the package substrate 2100 may be implemented as a printed circuit board. The package substrate 2100 may include a package substrate body 2120, package upper pads 2130 (see FIG. 21) disposed on the upper surface of the package substrate body 2120, lower pads 2125 disposed on the lower surface of the package substrate body 2120 or exposed through the lower surface, and internal wirings 2135 electrically connecting the upper pads 2130 to the lower pads 2125 in the package substrate body 2120. The upper pads 2130 may be electrically connected to the connection structures 2400. The lower pads 2125 may be connected to the wiring patterns 2005 of the main board 2010 of the data storage system 2000 as illustrated in FIG. 17 through conductive connection portions 2800.

Each of the semiconductor chips 2200 may include a semiconductor substrate 3010 and a first structure 3100 and a second structure 3200 stacked in sequence on the semiconductor substrate 3010. The first structure 3100 may include a peripheral circuit region including peripheral wirings 3110. The second structure 3200 may include a common source line 3205, a gate stack structure 3210 on the common source line 3205, channel structures 3220 penetrating through the gate stack structure 3210 and isolation regions 3230, bit lines 3240 electrically connected to the memory channel structures 3220, and gate contact plugs 3235 electrically connected to the word lines WL (see FIG. 16) of the gate stack structure 3210. As described above with reference to FIGS. 1 to 9, in each of the semiconductor chips 2200, the isolation structures MS may include first and second isolation bent portions MS_BP1 and MS_BP2, the channel structures CH may include the channel bent portion CH_BP, the first isolation bent portion MS_BP and the channel bent portion CH_BP may be disposed on a level in the intermediate insulating layer 125, and the second isolation bent portion MS_BP may be disposed on a level between the stack structure GS and the upper support structure 185. In an example embodiment, the first isolation bent portion MS_BP may be disposed on a level higher than a level of the channel bent portion CH_BP.

Each of the semiconductor chips 2200 may include a through wiring 3245 electrically connected to the peripheral wires 3110 of the first structure 3100 and extending into the second structure 3200. The through wiring 3245 may be disposed externally of the gate stack structure 3210, and may be further disposed to penetrate through the gate stack structure 3210. Each of the semiconductor chips 2200 may further include an input/output pad 2210 (see FIG. 17) electrically connected to the peripheral wirings 3110 of the first structure 3100.

According to the aforementioned example embodiments, by addressing process difficulty by simultaneously forming a hole and a trench for forming the second channel structure and the second isolation structure, a semiconductor device having an improved production yield, and a data storage system including the same may be provided.

Also, by further including an upper support structure for supporting the isolation structure, a semiconductor device having improved production yield, and a data storage system including the same may be provided.

One or more elements described above may be implemented using processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, a programmable logic unit, a microprocessor, application-specific integrated circuit (ASIC), etc. The processing circuitry may include a memory such as a volatile memory device (e.g., SRAM, DRAM, SDRAM) and/or a non-volatile memory (e.g., flash memory device, phase-change memory, ferroelectric memory device).

While some example embodiments have been illustrated and described above, it will be apparent to those skilled in the art that modifications and variations could be made without departing from the scope of the present disclosure as defined by the appended claims.

What is claimed is:

1. A semiconductor device, comprising:
a lower structure including a substrate, the lower structure including a first region and a second region;
a stack structure on the lower structure,
the stack structure including gate electrodes stacked on each other on the first region of the lower structure, the gate electrodes being spaced apart from each other in a vertical direction perpendicular to a surface of the lower structure,
the gate electrodes having a staircase shape on the second region of the lower structure and the gate electrodes extending in a first horizontal direction,
the first horizontal direction being parallel to the surface of the lower structure, and
the stack structure including interlayer insulating layers alternately stacked with the gate electrodes;
channel structures penetrating through the gate electrodes on the first region of the lower structure, and each of the channel structures including a channel layer; and
isolation structures penetrating through the gate electrodes, the isolation structure extending in the first horizontal direction, and
the isolation structure being spaced apart from each other in a second horizontal direction intersecting the first horizontal direction,
wherein each of the channel structures includes a first channel structure, a second channel structure on the first channel structure, and a channel bent portion between the first channel structure and the second channel structure,
wherein each of the isolation structures includes a first isolation structure, a second isolation structure on the first isolation structure, a third isolation structure on the second isolation structure, a first isolation bent portion between the first isolation structure and the second isolation structure, and a second isolation bent portion between the second isolation structure and the third isolation structure, and
wherein a width of an upper surface of the second isolation structure is narrower than a width of a lower surface of the third isolation structure.

2. The semiconductor device of claim 1,
wherein the first channel structure and the second channel structure are integrally connected to each other,
wherein the first isolation structure, the second isolation structure, and the third isolation structure are integrally connected to each other, and
wherein the channel layer continuously extends in the first channel structure and the second channel structure.

3. The semiconductor device of claim 1, wherein a level of the first isolation bent portion is higher than a level of the channel bent portion.

4. The semiconductor device of claim 1, wherein a level of the second isolation bent portion is lower than a level of the upper surface of each of the channel structures.

5. The semiconductor device of claim 1, wherein
the stack structure includes a lower stack structure, an intermediate insulating layer on the lower stack structure, and an upper stack structure on the intermediate insulating layer,
the lower stack structure includes first gate electrodes and first interlayer insulating layers alternately stacked,
the upper stack structure includes second gate electrodes and second interlayer insulating layers alternately stacked on the intermediate insulating layer, and
a level of the channel bent portion and a level of the first isolation bent portion are disposed at a level of the intermediate insulating layer.

6. The semiconductor device of claim 5,
wherein a number of the first gate electrodes is greater than a number of the second gate electrodes, and
wherein an average width of the first isolation structure is greater than an average width of the second isolation structure.

7. The semiconductor device of claim 1, further comprising:
a capping insulating layer covering the stack structure,
wherein each of the channel structures penetrates through the capping insulating layer and the stack structure and is in contact with the substrate, and
wherein a level of the second isolation bent portion is between a level of uppermost surface of the stack structure and a level of an upper surface of the capping insulating layer.

8. The semiconductor device of claim 1, further comprising:

a capping insulating layer covering the stack structure; and an upper support structure on the capping insulating layer, wherein the upper support structure includes a plurality of through regions, and the third isolation structure fills the plurality of through regions.

9. The semiconductor device of claim 8, wherein each of the isolation structures includes a first portion overlapping the plurality of through regions in the vertical direction and a remaining second portion, and wherein, in a corresponding isolation structure among the isolation structures, a level of an upper surface of the first portion of the corresponding isolation structure is higher than a level of an upper surface of the remaining second portion of the corresponding isolation structure.

10. The semiconductor device of claim 9, wherein an upper surface of the first portion of the corresponding isolation structure is at substantially a same level as a level of an upper surface of the upper support structure, and wherein an upper surface of each of the channel structures and an upper surface of the remaining second portion of the corresponding isolation structure are at a substantially equal level with a level of an upper surface of the capping insulating layer.

11. The semiconductor device of claim 1, wherein each of the channel structures further includes a channel filling insulating layer, a conductive pad on the channel filling insulating layer, and a dielectric layer between the channel filling insulating layer and the stack structure, and wherein the channel layer is between the channel filling insulating layer and the dielectric layer.

12. The semiconductor device of claim 11, further comprising:

sacrificial insulating layers on the second region of the lower structure, the sacrificial insulating layers spaced apart from the gate electrodes and alternately stacked with the interlayer insulating layers;

a through contact plug penetrating the sacrificial insulating layers; and a barrier structure surrounding the sacrificial insulating layers and allowing the sacrificial insulating layers and the gate electrodes to be spaced apart from each other, wherein the lower structure includes a first substrate, a peripheral circuit structure including circuit devices on the first substrate, and a second substrate on the peripheral circuit structure, wherein, in the lower structure, the substrate having the first region and the second region is the second substrate, wherein the through contact plug electrically connects the gate electrodes to the circuit devices in the lower structure, wherein the barrier structure includes a barrier filling insulating layer including a material of the channel filling insulating layer, a first barrier material layer covering an external side surface of the barrier filling insulating layer and including a material of the channel layer, and a second barrier material layer covering an external side surface of the first barrier material layer and including a material of the dielectric layer.

13. The semiconductor device of claim 12, wherein the barrier structure further includes a bent portion at substantially a same level with a level of the first isolation bent portion.

14. The semiconductor device of claim 11, further comprising:

a dummy support structure penetrating through the stack structure and in contact with the substrate on the second region, wherein the dummy support structure includes a dummy vertical pillar including a material of the channel filling insulating layer, a first dummy material layer covering an external side surface of the dummy vertical pillar and including a material of the channel layer, and a second dummy material layer covering an external side surface of the first dummy material layer and including a material of the dielectric layer.

15. The semiconductor device of claim 14, wherein the dummy support structure includes a bent portion at substantially a same level as a level of the first isolation bent portion.

16. A semiconductor device, comprising:

a peripheral circuit structure including a first substrate and circuit devices on the first substrate;

a second substrate on the peripheral circuit structure;

a first horizontal layer and a second horizontal conductive layer sequentially on the second substrate;

gate electrodes stacked on the second horizontal conductive layer, the gate electrodes stacked on each other and spaced apart from each other in a first direction, the gate electrodes including lower gate electrodes and upper gate electrodes;

interlayer insulating layers stacked on the gate electrodes, the interlayer insulating layers including lower interlayer insulating layers and upper interlayer insulating layers;

an intermediate insulating layer between the lower gate electrodes and the upper gate electrodes;

a channel structure penetrating through the gate electrodes and the interlayer insulating layers, the channel structure in contact with the second substrate, and the channel structure including a channel layer;

a capping insulating layer covering the gate electrodes; and isolation structure penetrating through the gate electrodes and the interlayer insulating layers, the isolation structure extending in a second direction perpendicular to the first direction, wherein the channel structure further includes a channel bent portion at a first level in the intermediate insulating layer, wherein the isolation structure further includes an isolation bent portion at a second level in the intermediate insulating layer, and wherein the first level is lower than the second level.

17. The semiconductor device of claim 16, further comprising:

an upper support structure on the capping insulating layer, the upper support structure including a plurality of through regions, wherein the plurality of through regions are spaced apart from each other in the second direction, wherein at least a portion of the isolation structure extends to the plurality of through regions and filling the plurality of through regions, wherein the isolation structure includes a first portion and a second portion on a plane, the first portion of the isolation structure overlaps the plurality of through regions in the first direction, and the second portion of the isolation structure is an other portion of the isolation structure.

18. The semiconductor device of claim 17, wherein a level of an upper surface of the first portion is higher than a level of an upper surface of the second portion, and wherein the level of an upper surface of the second portion is substantially a same level as a level of an upper surface of the channel structure.

19. A data storage system, comprising:

a semiconductor storage device including a lower structure, a stack structure on the lower structure, channel structures, isolation structures, and an input/output pad, the lower structure including a first substrate, circuit devices on the first substrate, and a second substrate on the circuit devices, the second substrate having a first region and a second region, the stack structure including gate electrodes stacked and spaced apart from each other in a vertical direction on the first region of the second substrate, the vertical direction being perpendicular to the an upper surface of the lower structure, and the gate electrodes on the second region of the second substrate extending in a staircase shape in a first horizontal direction, the first horizontal direction being parallel to the upper surface of the lower structure, the stack structure including interlayer insulating layers alternately stacked with the gate electrodes, the channel structures penetrating through the gate electrodes on the first region of the second substrate and each of the channel structures including a channel layer, the isolation structures penetrating through the gate electrodes, the isolation structures extending in the first horizontal direction and being spaced apart from each other in a second horizontal direction, the second horizontal direction intersecting the first horizontal direction, and the input/output pad being electrically connected to the circuit devices; and a controller electrically connected to the semiconductor storage device through the input/output pad and configured to control the semiconductor storage device, wherein each of the channel structures includes a first channel structure, a second channel structure on the first channel structure, and a channel bent portion between the first channel structure and the second channel structure, wherein each of the isolation structures includes a first isolation structure, a second isolation structure on the first isolation structure, a third isolation structure on the second isolation structure, a first isolation bent portion between the first isolation structure and the second isolation structure, and a second isolation bent portion between the second isolation structure and the third isolation structure, and wherein a width of an upper surface of the second isolation structure is narrower than a width of a lower surface of the third isolation structure.

20. The data storage system of claim 19, wherein the first isolation bent portion is at a level higher than a level of the channel bent portion, and wherein the second isolation bent portion is at a level lower than a level of the upper surface of each of the channel structures.

* * * * *